(12) United States Patent
Yoshiba

(10) Patent No.: US 6,457,148 B1
(45) Date of Patent: Sep. 24, 2002

(54) APPARATUS FOR TESTING SEMICONDUCTOR DEVICE

(75) Inventor: Kazumichi Yoshiba, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/402,839

(22) PCT Filed: Feb. 9, 1999

(86) PCT No.: PCT/JP99/00548

§ 371 (c)(1), (2), (4) Date: Oct. 12, 1999

(87) PCT Pub. No.: WO99/40450

PCT Pub. Date: Aug. 12, 1999

(30) Foreign Application Priority Data

Feb. 9, 1998 (JP) ............................................. 10-026922

(51) Int. Cl.⁷ ......................... G11C 29/00; G01R 31/28; G06F 11/00

(52) U.S. Cl. ......................... 714/718; 714/30; 714/736; 714/738; 365/201; 324/765

(58) Field of Search ......................... 714/718, 30, 726, 714/733, 734, 735, 736, 738, 742, 743, 744; 324/73.1, 765; 368/10, 113; 365/201, 233

(56) References Cited

U.S. PATENT DOCUMENTS

| | | | | |
|---|---|---|---|---|
| 4,389,723 A | * | 6/1983 | Nigorikawa et al. | 714/738 |
| 4,833,676 A | * | 5/1989 | Koo | 714/726 |
| 4,905,183 A | | 2/1990 | Kawaguchi et al. | 712/19 |
| 5,732,047 A | * | 3/1998 | Niijima | 368/10 |
| 5,751,738 A | | 5/1998 | Shimura | 714/744 |
| 5,761,100 A | | 6/1998 | Itoh et al. | 708/270 |
| 6,049,901 A | * | 4/2000 | Stock et al. | 714/726 |
| 6,058,057 A | * | 5/2000 | Ochiai et al. | 365/201 |

FOREIGN PATENT DOCUMENTS

| | | |
|---|---|---|
| EP | 0255118 | 2/1988 |
| JP | 63187170 | 8/1988 |
| JP | 6469973 | 3/1989 |
| JP | 862304 | 3/1996 |
| JP | 9-26466 | 1/1997 |

* cited by examiner

*Primary Examiner*—Emmanuel L. Moise
(74) *Attorney, Agent, or Firm*—David N. Lathrop, Esq.; Gallagher & Lathrop

(57) ABSTRACT

A multi-way interleave-type semiconductor device testing apparatus is provided, which is capable of testing an IC under test in either case that the latency (the number of delay cycles) N of the IC under test is an odd number or an even number. In each of plural test circuit units (4-1 and 4-2) is provided a clock control circuit (23) comprising an adder for adding up the test period Tr of the IC tester and a clock setting value Tc, and a selector (22) for selecting the output from the adder or the clock setting value Tc to output the selected one. The latency is set in a delay setting register (5) which supplies to the selector a binary number "0" when the latency is an even number and a binary number "1" when the latency is an odd number. The selector outputs the clock setting value in case of "0" and outputs the sum of the test period and the clock setting value in case of "1", so that a clock generator (7) outputs the period signal of the test circuit unit at a timing corresponding to the input signal. In a pattern delay circuit (6) is set a delay time obtained by multiplication of the period of the period signal by a decimal number supplied from the delay setting register, thereby to delay an expected value signal EXP to supply it to a logical comparator (9).

10 Claims, 11 Drawing Sheets

FIG. 5

| LATENCY N | BINARY EXPRESSION OF N | | | NUMBER OF DELAY CYCLES OF PATTERN DELAY CIRCUIT | |
|---|---|---|---|---|---|
| | D2 | D1 | D0 | N = EVEN $\frac{N}{2}$ | N = ODD $\frac{N-1}{2}$ |
| 0 | 0 | 0 | 0 | 0 | — |
| 1 | 0 | 0 | 1 | — | 0 |
| 2 | 0 | 1 | 0 | 1 | — |
| 3 | 0 | 1 | 1 | — | 1 |
| 4 | 1 | 0 | 0 | 2 | — |
| 5 | 1 | 0 | 1 | — | 2 |
| 6 | 1 | 1 | 0 | 3 | — |
| 7 | 1 | 1 | 1 | — | 3 |

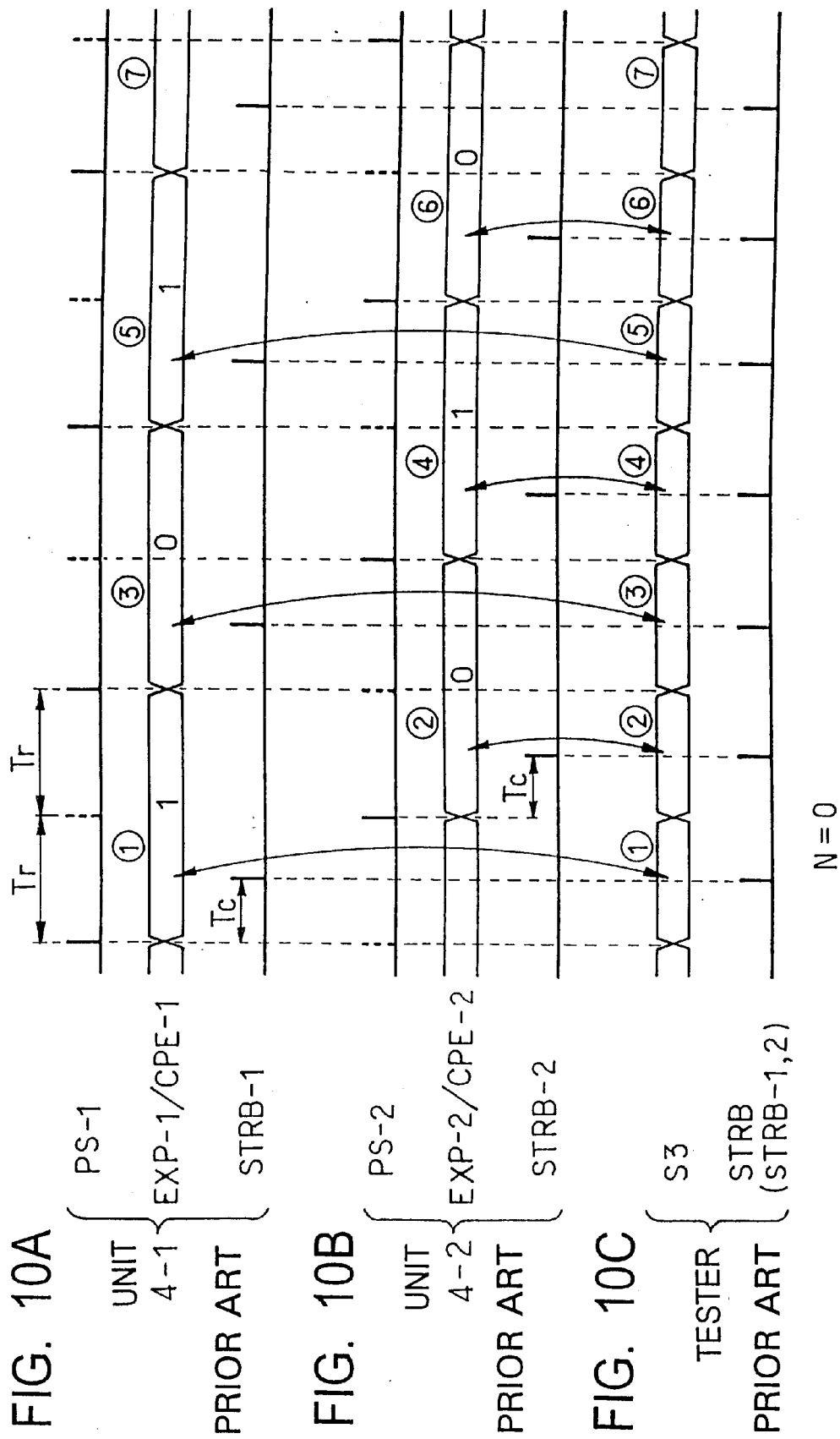

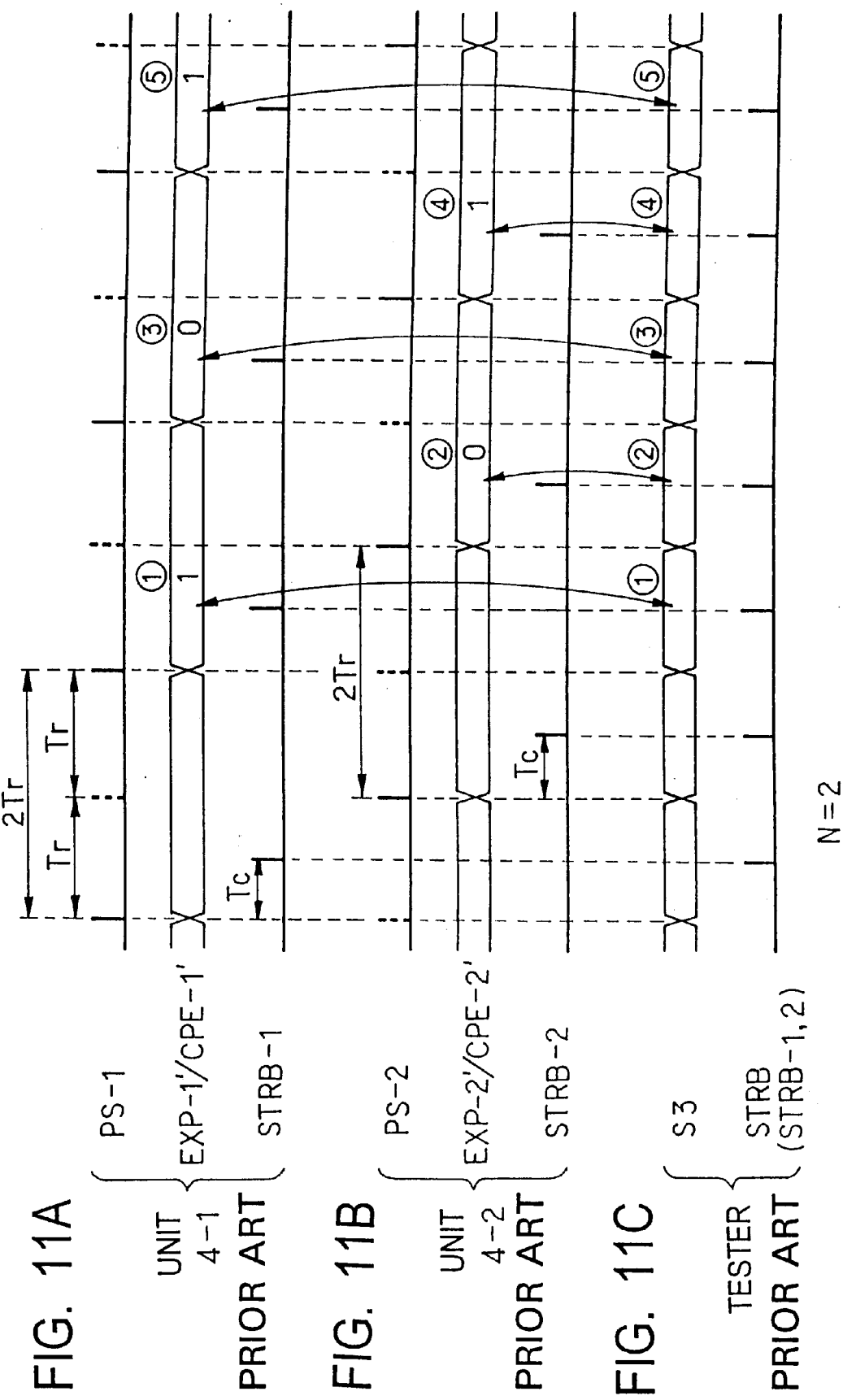

APPARATUS FOR TESTING SEMICONDUCTOR DEVICE

TECHNICAL FIELD

The present invention relates to a multi-way interleave-type semiconductor device testing apparatus in which a plurality of test circuit units each having the same circuit configuration are provided and these test circuit units are operated in interleaved manner, thereby to permit the testing apparatus to test semiconductor devices at high speed.

BACKGROUND ART

FIG. 7 shows an example of the semiconductor device testing apparatus (hereinafter referred to as IC tester) for testing, for example, a semiconductor integrated circuit (hereinafter referred to as IC) which is a typical example of the semiconductor devices. The illustrated IC tester TES comprises, mainly, a main controller 30, a pattern generator 10, a timing generator 31, a waveform shaping device 32, a waveform generator 33, a group of drivers 1, a group of level comparators 3, a logical comparator 9, a failure analysis memory 34, and a device power supply 35.

The main controller 30 is generally constructed by a computer system, and mainly controls the pattern generator 10 and the timing generator 31 in accordance with a test program PM created by a user. Although not shown, the timing generator 31 generally comprises a period generator, a clock control circuit, and a clock generator.

First, before a testing for ICs is started, various kinds of data are set in the IC tester from the main controller 30. After the various kinds of data have been set, a testing for ICs is started. By a test start instruction or command applied to the pattern generator 10 from the main controller 30, the pattern generator 10 starts to generate a pattern. Accordingly, the time point that the pattern generator 10 starts to generate a pattern becomes the time point of starting a testing. The pattern generator 10 supplies test pattern data to the waveform shaping device 32 and at the same time, supplies timing set information (which is also called timing set data) TS to a period generator and a clock generator, both of which are not shown, of the timing generator 31.

The timing set information means a pair of one information for selecting period data previously set in a period data memory of the period generator and another information for selecting clock data previously set in a clock data memory of the clock generator. The timing set information is previously programmed by a user.

By application of the timing set information TS to the timing generator 31, the timing generator 31 generates a timing signal (clock pulse) for controlling timings of operation of the waveform shaping device 32, the logical comparator 9 and the like.

The test pattern data outputted from the pattern generator 10 in synchronism with the period data of the period generator is converted to a test pattern signal having a real waveform by the waveform shaping device 32 and the waveform generator 33 located at the succeeding stage of the waveform shaping device 32. The test pattern signal is applied to an IC under test (commonly called DUT) 2 through a group of the drivers 1 to store it in the memory of the IC under test 2.

On the other hand, a response signal read out of the IC under test 2 is compared in a group of the level (analog) comparators 3 with a reference voltage from a comparison reference voltage source (not shown) to determine whether or not the response signal has a predetermined logical level (a voltage of H logical level (high logical level), or a voltage of L logical level (low logical level)). A response signal which has been determined to have the predetermined logical level is sent to the logical comparator 9 where the response signal is compared with an expected value signal (data) outputted from the pattern generator 10.

When the response signal does not coincide with the expected value signal, the memory cell of the IC under test 2 at the address thereof from which that response signal has been read out is determined to be defective or a failure, and a failure (FAIL) signal is generated indicating that the memory cell read out of the IC under test 2 is failure, and is stored in the failure analysis memory 34. Usually, the failure signal is stored in a memory cell of the failure analysis memory 19 having the same address as that of the IC under test 20.

On the contrary, when the response signal coincides with the expected value data, the memory cell of the IC under test 2 at the address thereof from which that response signal has been read out is determined to be normal, and a pass signal indicating that the memory cell read out of the IC under test 2 is not defective is generated. Usually, this pass signal is not stored in the failure analysis memory 34. At the time of completion of the test, the failure signals stored in the failure analysis memory 34 are read out thereof to determine, for example, whether the failure memory cell or cells of the tested IC 2 can be relieved or not.

As discussed above, the timing generator 31 generates, in accordance with the timing set information TS given from the pattern generator 10, timing signals (clock pulses) for defining a rising timing and a falling timing of the waveform of a test pattern signal which is to be applied to an IC under test 2, timing signals (clock pulses) for a strobe pulse defining a timing of the logical comparison in the logical comparator 9, and the like.

Timings and periods for generating those timing signals are written as timing set information in the test program PM created by a user, and the IC tester is arranged such that a test pattern signal is applied to an IC under test 2 with an operating period or duty cycle and at a timing intended by a user to operate the IC under test 2, and that whether the operation of the IC under test 2 is proper or not can be tested.

As shown in FIG. 7, a semiconductor device testing apparatus having one timing generator 31, one pattern generator 10, one waveform shaping device 32, and one logical comparator 9 provided therein, and wherein a test pattern signal is generated using a timing signal (clock pulses) outputted from the one timing generator 31 to test the semiconductor device under test is called one-way system testing apparatus in this technical field.

On the contrary, a semiconductor device testing apparatus having a plurality of basic test circuit units provided therein, each basic test unit comprising one timing generator 31, one pattern generator 10, one waveform shaping device 32, and one logical comparator 9, and wherein timing signals (clock pulses) outputted from the timing generators of the plurality of basic test circuit units are multiplexed, and the plurality of basic test circuit units are operated in interleaved manner using the multiplexed timing signals to generate a test pattern signal, thereby to test a semiconductor device under test is called a multi-way interleave-type testing apparatus in this technical field (the interleave operation of the plurality of basic test circuit units means that the plurality of basic test circuit units are sequentially operated within one cycle (one period) at timings shifted a little by a little from one another, that is, the plurality of basic test circuit units are operated in parallel manner within one cycle).

A semiconductor memory having a clock synchronous type interface (a device of synchronous type) such as a synchronous DRAM (a synchronous dynamic RAM) has a function for delaying an output cycle of data therein, and by setting the number of cycles to be delayed in a register within the memory, the memory can output an input data thereinto with a delay corresponding to the number of cycles set in the register. The number of cycles to be delayed is called latency in this technical field.

In case of testing such a synchronous type device in a semiconductor device testing apparatus, it is necessary to delay an expected value signal (EXP) and a comparison enable signal (CPE) outputted from a pattern generator by a latency set in the device under test. For this reason, there is provided between a pattern generator and a logical comparator a pattern delay circuit in which a delay time (the number of cycles to be delayed) corresponding to the latency set in the device under test is set, thereby to delay an expected value signal and a comparison enable signal to perform a logical comparison.

FIG. 8 shows an example of the conventional two-way interleave-type IC tester which is constructed such that synchronous type devices can also be tested. Since this IC tester adopts a two-way interleave-type, there are provided in the IC tester a set of the aforementioned basic test circuit units (each comprising the timing generator 31, the pattern generator 10, the waveform shaping device 32, and the logical comparator 9). The IC tester is arranged such that these two basic test circuit units (a first test circuit unit 4-1 and a second test circuit unit 4-2) are alternately operated (operated in interleave manner or interleaved in operated) in one cycle (one period) to generate a test pattern signal S1 to be applied to the IC under test 2 at high rate, and also to read out a response signal S2 from the IC under test 2 at high rate to perform a logical comparison, so that the test for the IC under test 2 can be carried out at high speed. Further, since the first and the second test circuit units 4-1 and 4-2 have the same circuit configuration with each other, the circuit configuration of the second test circuit unit 4-2 is not shown in FIG. 8. However, the components, signals and data of the first test circuit unit 4-1 will be shown by adding "1" after a hyphen (-) to their reference characters, and also the components, signals and data of the second test circuit unit 4-2 will be shown by adding "2" after a hyphen (-) to their reference characters.

In order to make it possible to test a synchronous type device, the first and the second test circuit units 4-1 and 4-2 further comprise pattern delay circuits 6-1 and 6-2 (6-2 is not shown), respectively, and also delay setting registers 5-1 and 5-2 (5-2 is not shown) for setting a delay time (the number of cycles to be delayed) corresponding to the latency set in the IC under test 2 in the pattern delay circuits 6-1 and 6-2, respectively. The pattern delay circuit 6-1 is connected between the pattern generator 10-1 and the logical comparator 9-1. The pattern delay circuit 6-2 is connected between the pattern generator 10-2 (not shown) and the logical comparator 9-2 (not shown). Further, the period generator and the clock control circuit in the timing generator 31, and the waveform shaping device 32 in the test circuit unit shown in FIG. 7 are unnecessary components here, and those components have been removed from FIG. 8. In addition, in order to simplify the explanation, portions and elements in FIG. 8 corresponding to those in FIG. 7 are shown by the same reference characters affixed thereto and the explanation thereof will be omitted unless it is necessary.

In the two-way interleave-type IC tester shown in FIG. 8, the pattern generators 10-1 and 10-2 are alternately operated, and test pattern data outputted as a result of the alternate operation are converted to a test pattern signal S1 having a real waveform by waveform shaping devices (not shown) and a waveform generator (not shown). This test pattern signal S1 is applied to the IC under test 2 via the driver group 1. A response signal S2 read out from the IC under test 2 is compared in the level comparator group 3 with a reference voltage Vr from the comparison reference voltage source (not shown) to determine whether the response signal S2 has a predetermined logical level (a voltage of H logic (high logic) or a voltage of L logic (low logic)) or not. The response signal determined to have the predetermined logical level is converted to a logical signal S3 which is in turn sent to the timing comparators 8-1 and 8-2 (8-2 is not shown). The logical signal S3 supplied to the timing comparators 8-1 or 8-2 is then strobed by a strobe signal STRB-1 or STRB-2 (STRB-2 is not shown) outputted from the clock generator 7-1 or 7-2 (7-2 is not shown) of the timing generator (not shown). Generally, a response signal S2 having the predetermined H logic is converted to a logical "1" signal and a response signal S2 having the predetermined L logic is converted to a logical "0" signal, respectively, in the level comparator group 3.

Logical signals S4-1 and S4-2 (S4-2 is not shown) their timings of which are defined by the strobe signals STRB-1 and STRB-2 respectively are supplied to the logical comparators 9-1 and 9-2. In the case that the IC under test is not a synchronous type device, the logical signals S4-1 and S4-2 are logically compared with expected value signals (data) EXP-1 and EXP-2 (EXP-2 is not shown) outputted from the pattern generators 10-1 and 10-2, respectively.

If the comparison result thereof indicates an anticoincidence, a failure signal (FAIL) is generated by each of the logical comparator 9-1 and 9-2, and the failure signal is stored in the associated failure analysis memory (not shown). Generally, as a failure signal is generated a logical "1" signal which is stored in the same address of the failure analysis memory as that of the IC under test 2. On the contrary, if the comparison result thereof indicates a coincidence, a pass signal (PASS) is generated by each of the logical comparator 9-1 or 9-2. Usually, the pass signal is not stored in the failure analysis memory. Further, in FIG. 8, the failure signals and/or the pass signals outputted from the logical comparators 9-1 and 9-2 are shown by reference characters FAIL/PASS-1 and FAIL/PASS-2, respectively.

In the case that the IC under test is a synchronous type device, the expected value signals EXP-1 and EXP-2 as well as the comparison enable signals CPE-1 and CPE-2 (CPE-2 is not shown) outputted from the pattern generators 10-1 and 10-2 respectively are delayed in the pattern delay circuits 6-1 and 6-2 by a delay time (the number of cycles to be delayed) corresponding to the latency set in the IC under test 2, and are supplied to the logical comparators 9-1 and 9-2, respectively. The logical signals S4-1 and S4-2 are logically compared with these delayed expected value signals EXP-1' and EXP-2' (EXP-2' is not shown), respectively. In this case, likewise, if the comparison result thereof indicates an anticoincidence, a failure signal (FAIL) is generated by each of the logical comparator 9-1 or 9-2 and the failure signal is stored in the associated failure analysis memory. If the comparison result thereof indicates a coincidence, a pass signal (PASS) is generated.

Since the IC tester shown in FIG. 8 is a two-way interleave-type one, the operating period (cycle) of each of the first and the second test circuit units 4-1 and 4-2 is two times the test period (called rate) of the IC tester. As a result, as shown in FIGS. 10 and 11, the clock generators 7-1 and 7-2 generate period signals PS-1 and PS-2 respectively each having its period of two times the test period Tr of the IC tester, as well as generate strobe signals STRB-1 and STRB-2 respectively each having its period of two times the test period Tr of the IC tester. In addition, the clock generator 7-2 of the second test circuit unit 4-2 generates the period signal PS-2 and the strobe signal STRB-2 at the time point (timing) delayed respectively by the test period Tr of the IC tester from the period signal PS-1 and the strobe signal STRB-1 of the clock generator 7-1 of the first test circuit unit 4-1. In this case, however, since the clock setting value Tc for setting timings of clocks generated from the clock generators 7-1 and 7-2 is set to a value by which the strobe signals STRB-1 and STRB-2 are generated at intermediate points of the test period Tr of the IC tester respectively, the strobe signals STRB-1 and STRB-2 are generated from the clock generators 7-1 and 7-2 with a delay time corresponding to the clock setting value Tc from the period signals PS-1 and PS-2, respectively. In other words, the strobe signals STRB-1 and STRB-2 are pulse signals which can be obtained by delaying the period signals PS-1 and PS-2 by the time interval corresponding to the clock setting value Tc.

FIG. 10 is a timing chart in the case that the expected value signals EXP-1 and EXP-2 as well as the comparison enable signals CPE-1 and CPE-2 outputted respectively from the pattern generators 10-1 and 10-2 are not delayed by the pattern delay circuits 6-1 and 6-2, respectively. FIG. 10A is a timing chart for the first test circuit unit 4-1, FIG. 10B is a timing chart for the second test circuit unit 4-2, and FIG. 10C is a timing chart for explaining the comparison operations in the IC tester. FIG. 11 is a timing chart in the case that the expected value signals EXP-1 and EXP-2 as well as the comparison enable signals CPE-1 and CPE-2 outputted respectively from the pattern generators 10-1 and 10-2 are delayed by the pattern delay circuits 6-1 and 6-2, respectively, by one cycle, namely, a time interval corresponding to the two times the test period Tr of the IC tester. FIG. 11A is a timing chart for the first test circuit unit 4-1, FIG. 11B is a timing chart for the second test circuit unit 4-2, and FIG. 11C is a timing chart for explaining the comparison operations in the IC tester. Further, in those drawings, it is assumed that each of the expected value signals EXP-1 and EXP-2 as well as each of the comparison enable signals CPE-1 and CPE-2 are outputted, in the first test circuit unit 4-1, from the pattern generator 10-1 in the sequence of logical "1", logical "0", logical "1", . . . , and is outputted, in the second test circuit unit 4-2, from the pattern generator 10-2 in the sequence of logical "0", logical "1", logical "0", . . . .

As can be understood easily from FIGS. 10 and 11, in the first test circuit unit 4-1, with regard to the expected value signal EXP-1, the first half of each cycle thereof corresponding to one of odd periods (1), (3), (5), . . . among the successive test periods Tr of the IC tester is logically compared in the timing comparator 8-1 with a logical signal S4-1 which is strobed by a strobe signal. STRB-1, whereas in the second test circuit unit 4-2, with respect to the expected value signal EXP-2, the first half of each cycle thereof corresponding to one of even periods (2), (4), (6), . . . among the successive test periods Tr of the IC tester is logically compared in the timing comparator 8-2 with a logical signal S4-2 which is strobed by a strobe signal STRB-2. In other words, with respect to the expected value signals EXP-1 and EXP-2, the first half of each cycle of the expected value signal EXP-1 and the first half of each of the expected value signal EXP-2 are logically compared with logical signals S3 alternately outputted with the test period Tr of the IC tester from associated one level comparator of the level comparator group 3. Therefore, each of the logical signals S3 outputted from the level comparator group 3 is logically compared in the logical comparators 9-1 and 9-2 with the expected value signal at high rate with the test period Tr of the IC tester, i.e., with 1/2 of the period of the expected value signal or the strobe signal.

In FIG. 11, since the latency of the IC under test 2 is 2, a response signal S2 from the IC under test 2 is outputted with a delay time of two test periods (2×Tr). Accordingly, a logical signal S3 outputted from each of the level comparator group 3 is also delayed by two test periods. On the other hand, since the strobe signals STRB-1 and STRB-2 occur with no delay time, as shown in FIG. 11C, the first strobe pulses in these strobe signals STRB-1 and STRB-2 have no relation to the strobe operation, respectively, which does not bring about any problems at all. Since the delay amount for each of the pattern delay circuits 6-1 and 6-2 is set to one cycle corresponding to the latency equal to 2, the expected value signals EXP-1 and EXP-2 are delayed by one cycle and are supplied to the logical comparators 9-1 and 9-2 as expected value signals EXP-1' and EXP-2', respectively. Therefore, with respect to the expected value signals EXP-1' and EXP-2', their respective first half cycles are, at the time point delayed by one cycle further from the case of FIG. 10, logically compared alternately with the logical signals S4-1 and S4-2 strobed respectively by the strobe signals STRB-1 and STRB-2 with the period of the IC tester, respectively. As a result, the logical signal S3 outputted from each of the level comparator group 3 with the delay time of two times the test period is also logically compared with the expected value signals EXP-1' and EXP-2' with the test period Tr of the IC tester.

Further, as shown in FIG. 8, the IC tester may be constructed such that the failure/pass signals FAIL/PASS-1 and FAIL/PASS-2 outputted from the logical comparators 9-1 and 9-2 respectively may be inputted to an OR gate 11 if necessary, and be outputted from the OR gate 11 as the sum signal FAIL/PASS logically added one with the other.

Since the pattern delay circuits 6-1 and 6-2 each for delaying an expected value signal and a comparison enable signal by the desired number of cycles have the same circuit configuration with each other, FIG. 9 shows, as a typical example thereof, the pattern delay circuit 6-1 of the first test circuit unit 4-1. This pattern delay circuit 6-1 comprises a delay circuit 6a for the expected value signal EXP-1 and a delay circuit 6b for the comparison enable signal CPE-1. Each of the delay circuits 6a and 6b comprises a shift register 12 constituted by D-type flip-flops (D-F/F) of n stages connected in series (n=7 in FIG. 9) and a selector 13 (in this example, 8-1 selector) for selecting either one of the input and the output signals of each stage of the D-type flip-flops.

A period signal (clock pulse) PS-1 having its period of 2Tr is supplied, as a shift pulse, from the clock generator 7-1 to the D-type flop-flops at respective stages of the shift register 12. Accordingly, each of the D-type flip-flops delays the expected value signal/comparison enable signal EXP-1/CPE-1 by one cycle. On the other hand, to a select terminal SEL of the selector 13 is supplied a delay setting value (an amount of delay corresponding to a latency of the IC under test 2) to be set in the delay setting register 5-1. Accordingly, if the latency of the IC under test 2 is assumed to be N, N/2 is set in the delay setting register 5-1. Consequently, the selector 13 selects the output of the D-type flip-flop at the (N/2)-th stage from the input side of the shift register. As a result, the selector 13 outputs an expected value signal/a comparison enable signal EXP-1'/CPE-1' which are delayed by 2Tr×(N/2)=Tr×N from the inputted expected value signal/comparison enable signal EXP=1/CPE-1 respectively.

As mentioned above, in the case of delaying an expected value signal/a comparison enable signal outputted from each of the pattern generators 10-1 and 10-2 by the desired number of cycles, the prior art IC tester uses such circuit configuration that the number of cycles of the expected value signal/comparison enable signal to be delayed is set in the respective delay setting registers 5-1 and 5-2 of the first and the second test circuit units 4-1 and 4-2, and this number of delay cycles is supplied to the pattern delay circuits 6-1 and 6-2, thereby to delay the expected value signal/comparison enable signal.

However, as discussed above, since the operating period (one cycle) of each of the first and the second test circuit units 4-1 and 4-2 is two times the test period Tr of the IC tester, each period of the expected value signals EXP-1, EXP-2 and the comparison enable signals CPE-1, CPE-2 outputted respectively from the pattern generators 10-1 and 10-2 is 2×Tr and on the other hand, since the IC under test 2 is tested based on the test period (one test cycle) Tr of the IC tester, a test pattern signal is applied to the IC under test with the test period Tr. Therefore, one test cycle of the IC under test 2 becomes 1/2 of one cycle of the expected value signal/comparison enable signal.

For the above-mentioned reasons, in the prior art IC tester, the value of 1/2 (N/2) of the latency N of the IC under test 2 is set in the delay setting registers 5-1 and 5-2, and the delay amount (the number of cycles to be delayed) corresponding to the set value N/2 is set in the pattern delay circuits 6-1 and 6-2, thereby to delay the expected value signals/comparison enable signals. Specifically speaking, as shown in FIG. 8, n−1 delay amount setting lines D0, D1, . . . , Dn−2 are connected from the output sides of the delay setting registers 5-1 and 5-2 to the pattern delay circuits 6-1 and 6-2, respectively, and when the latency N of the IC under test 2 is 0, N/2=0 (no delay amount) is set in the delay setting registers 5-1 and 5-2. As a result, data indicating that the delay amount is 0 is sent to the pattern delay circuits 6-1 and 6-2 via the delay amount setting lines D0, D1, . . . , Dn−2. When the latency N of the IC under test 2 is 2, N/2=1 (which means that only one cycle is to be delayed) is set in the delay setting registers. As a result, data indicating that the delay amount is one cycle is sent to the pattern delay circuits 6-1 and 6-2 via the delay amount setting lines. Further, when the latency N of the IC under test 2 is 4, N/2=2 (which means that two cycle is to be delayed) is set in the delay setting registers. As a result, data indicating that the delay amount is two cycles is sent to the pattern delay circuits 6-1 and 6-2 via the delay amount setting lines. Thereafter, similar operations are repetitively performed.

Consequently, the prior art IC tester has a drawback that if the latency N of the IC under test 2 is an odd number, the number of cycles to be delayed cannot be set in the delay setting registers 5-1 and 5-2. In other words, the prior art IC tester of two-way interleave-type could not test synchronous type devices unless the latency N thereof is an even number.

Similarly, in a three-way interleave-type IC tester, the test period Tr of an IC under test becomes 1/3 of the period of each of the expected value signal/comparison enable signal or the strobe signal, and hence N/3 which is the value of 1/3 of the latency N of the device under test is set in the delay setting register of each of the test circuit units. Therefore, the prior art three-way interleave-type IC tester cannot test a synchronous type device unless the latency N thereof can be divided by 3 without any remainder.

In other words, in the prior art multi-way interleave-type IC testers, there is a serious drawback that they cannot test synchronous type devices unless the latency N thereof can be divided by the number of interleaves m without any remainder, that is, unless N/m becomes an integer.

DISCLOSURE OF THE INVENTION

It is an object of the present invention to provide a multi-way interleave-type semiconductor device testing apparatus which is capable of testing a semiconductor device under test even if the latency of the semiconductor device is either an even number or an odd number.

In order to accomplish the above object, in an aspect of the present invention, there is provided a semiconductor device testing apparatus in which a test pattern signal is produced on the basis of test pattern data outputted from a pattern generator and is applied to a semiconductor device under test, and a response signal outputted from the semiconductor device under test is logically compared with an expected value signal outputted from the pattern generator, thereby to determine whether the semiconductor device under test is defective or not defective, and comprising a plurality of test circuit units each comparing a response signal from the semiconductor device under test with an expected value signal from the pattern generator, the plurality of test circuit units being sequentially operated within one cycle thereby effecting logical comparisons at high rate, and wherein each of the plurality of test circuit units comprising: a clock generator for generating a period signal representing an operating period of associated one test circuit unit; a delay setting register in which a latency N is set, said latency N being the number of cycles that an output of a semiconductor device under test is to be delayed; a pattern delay circuit connected to the output side of said delay setting register via a required number of data transmission lines and for delaying the expected value signal by a time interval obtained by multiplying numerical value data transmitted from the delay setting register by the operating period; clock control means connected to the output side of said delay setting register via a required number of data transmission lines and for selecting, in response to numerical value data transmitted from the delay setting register, one of plural timing setting values to supply the selected timing setting value to the clock generator, each of said plural timing setting values setting a timing of generation of the period signal generated from the clock generator; and means for logically comparing a response signal from the semiconductor device under test with an expected value signal from the pattern delay circuit.

In a first preferred embodiment, the number of the test circuit units are two, and the clock control means comprises: adding means for adding up a test period Tr of the semiconductor device testing apparatus and a clock setting value Tc in which a timing of generation of the period signal generated from the clock generator has been preset; and a selector having a select terminal to which the least significant bit line among the data transmission lines is connected and for selecting the clock setting value Tc when the least significant bit line is "0", and selecting the sum Tc+Tr of the clock setting value and the test period which is the output of the adding means when the least significant bit line is "1". All higher bit lines among the data transmission lines except the least significant bit line are connected to the pattern delay circuit.

The pattern delay circuit delays the expected value signal by a delay time obtained by multiplying transmitted numerical value data by the test period.

In a second preferred embodiment, the clock control means comprises: a multiplier for multiplying numerical value data transmitted via the data transmission lines by a test period Tr of the semiconductor device testing apparatus; and adding means for adding up an output from the multiplier and a clock setting value Tc in which a timing of generation of the period signal generated from the clock generator has been preset. The number of interleave m is further set in the delay setting register, and the integer part of the quotient resulting from a division of the latency N by the number of interleaves m is transmitted to the pattern delay circuit via the data transmission lines. The pattern delay circuit delays the expected value signal by a delay time obtained by multiplying the transmitted numerical value data by the test period.

In a modified embodiment, the delay setting register transmits the latency N and the number of interleaves m to the pattern delay circuit via the data transmission lines. The pattern delay circuit takes out, from the latency N and the number of interleaves m transmitted thereto, the integer part of the quotient resulting from a division of N by m, and delays the expected value signal by a delay time obtained by multiplying the integer part by the test period.

The plurality of test circuit units may use one delay setting register in common.

BRIEF DESCRIPTION OF THE DRAWINGS

FIG. 5 is a diagram showing, in the semiconductor device testing apparatus shown in FIG. 1, the relationship between the latency N of an IC under test, the binary notation of the latency N when it is expressed by 3 bits, and the number of cycles to be delayed in a pattern delay circuit;

FIGS. 10 (10A, 10B, and 10C) is a timing chart of main portions of the IC tester shown in FIG. 8 in the case that the latency N of an IC under test is 0 (zero); and FIGS. 11 (11A, 11B, and 11C) is a timing chart of main portions of the IC tester shown in FIG. 8 in the case that the latency N of an IC under test is 2.

BEST MODE FOR CARRYING OUT THE INVENTION

Figure 1:
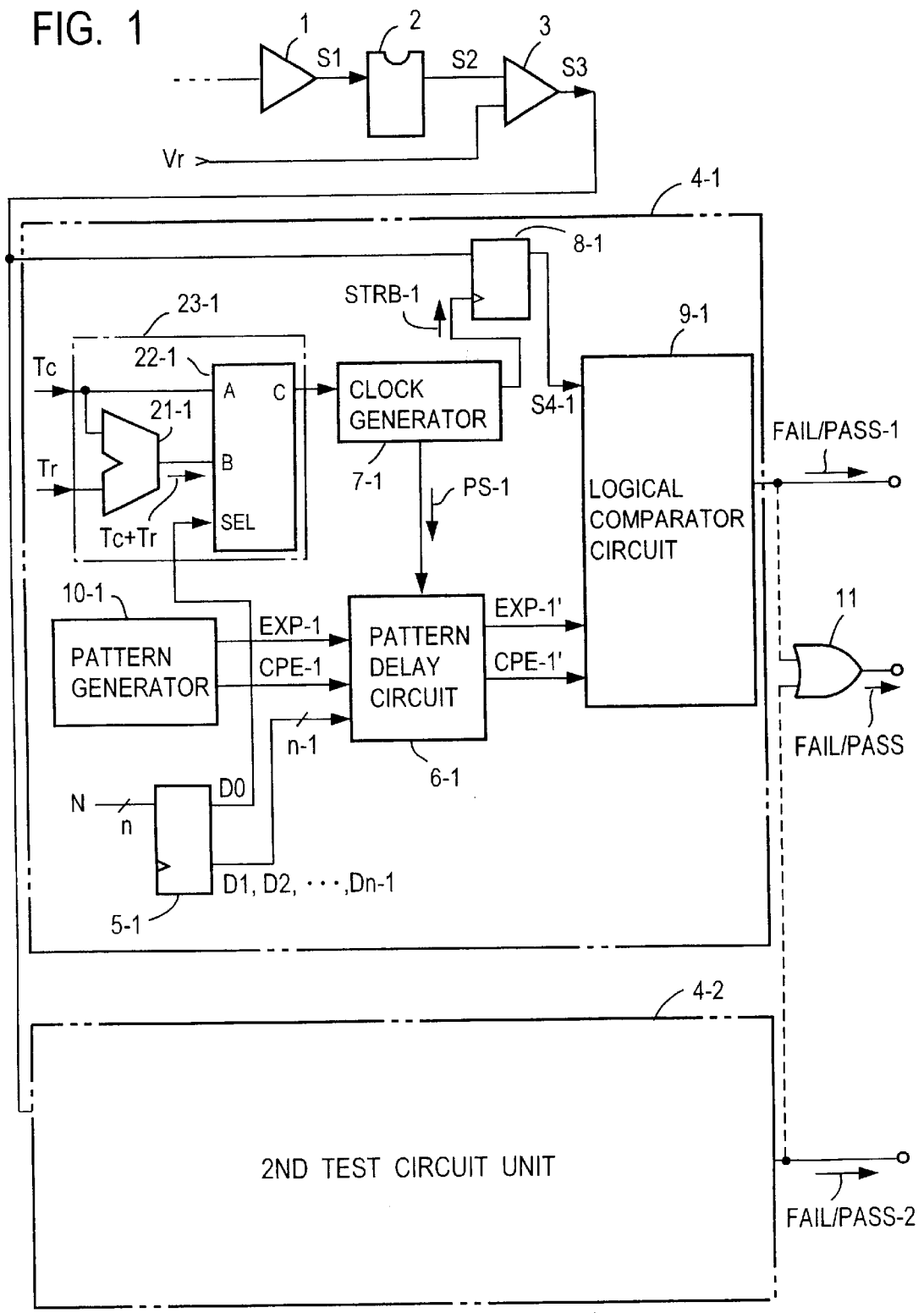
FIG. 1 is a block diagram showing a first embodiment of the semiconductor device testing apparatus according to the present invention.

Now, the present invention will be described in respect of some embodiments thereof in detail with reference to FIGS. 1 through 6. Further, for clarity of the description, the portions or the elements in FIGS. 1 and 6 corresponding to those in FIGS. 7 and 8 will be shown by the same reference characters affixed thereto and the explanation thereof will be omitted unless it is necessary.

FIG. 1 is a block diagram showing a first embodiment of the semiconductor device testing apparatus according to the present invention and shows a case in which the present invention is applied to a two-way interleave-type IC tester, Since the illustrated IC tester is a two-way interleave-type one, there are provided in the IC tester, as already described before, a set of a first test circuit unit 4-1 and a second test circuit unit 4-2. The IC tester is arranged such that these two test circuit units 4-1 and 4-2 are alternately operated (operated in interleave manner or interleaved in operated) in one operating cycle (one period) to generate a test pattern signal S1 to be applied to an IC under test 2 at high rate, and also to read out a response signal S2 from the IC under test 2 at high rate to perform a logical comparison, so that the test for the IC under test 2 can be carried out at high speed. Further, since the first and the second test circuit units 4-1 and 4-2 have the same circuit configuration with each other, the circuit configuration of the second test circuit unit 4-2 is not shown in FIG. 1. However, the components, signals and data of the first test circuit unit 4-1 will be shown by adding "1" after a hyphen (-) to their reference characters, and also the components, signals and data of the second test circuit unit 4-2 will be shown by adding "2" after a hyphen (-) to their reference characters.

In order to make it possible to test a synchronous type device, the first and the second test circuit units 4-1 and 4-2 further comprise pattern delay circuits 6-1 and 6-2 (6-2 is not shown) for delaying expected value signals/comparison enable signals EXP-1, EXP-2 (EXP-2 is not shown)/CPE-1, CPE-2 (CPE-2 is not shown) by a set delay amount, respectively, and delay setting registers 5-1 and 5-2 (5-2 is not shown) for setting a delay time corresponding to the latency set in the IC under test 2 in the pattern delay circuits 6-1 and 6-2, respectively. The pattern delay circuit 6-1 is connected between a pattern generator 10-1 and a logical comparator 9-1. The pattern delay circuit 6-2 is connected between a pattern generator 10-2 (not shown) and a logical comparator 9-2 (not shown).

In addition, a clock control circuit 23-1 constituted by an adder 21-1 and a selector 22-1 and a clock control circuit 23-2 (not shown) constituted by an adder 21-2 (not shown) and a selector 22-2 (not shown) are provided at the preceding stages to clock generators 7-1 and 7-2 (7-2 is not shown), respectively. The adder 21-1 adds up a clock setting value Tc for setting a timing of generation of a strobe signal (clock signal) STRB-1 from the clock generator 7-1, and the test period (rate) Tr of the IC tester, and gives the sum output an input terminal B of the selector 22-1 (2-1 selector). The adder 21-2 adds up a clock setting value Tc for setting a timing of generation of a strobe signal (clock signal) STRB-2 (not shown) from the clock generator 7-2, and the test period (rate) Tr of the IC tester, and gives the sum output an input terminal B of the selector 22-2 (2-1 selector). The clock setting value Tc is supplied to an input terminal A of associated one of the selectors 22-1 and 22-2. The output terminals C of these selectors are connected to input terminals of the clock generators 7-1 and 7-2, respectively.

Figure 7:
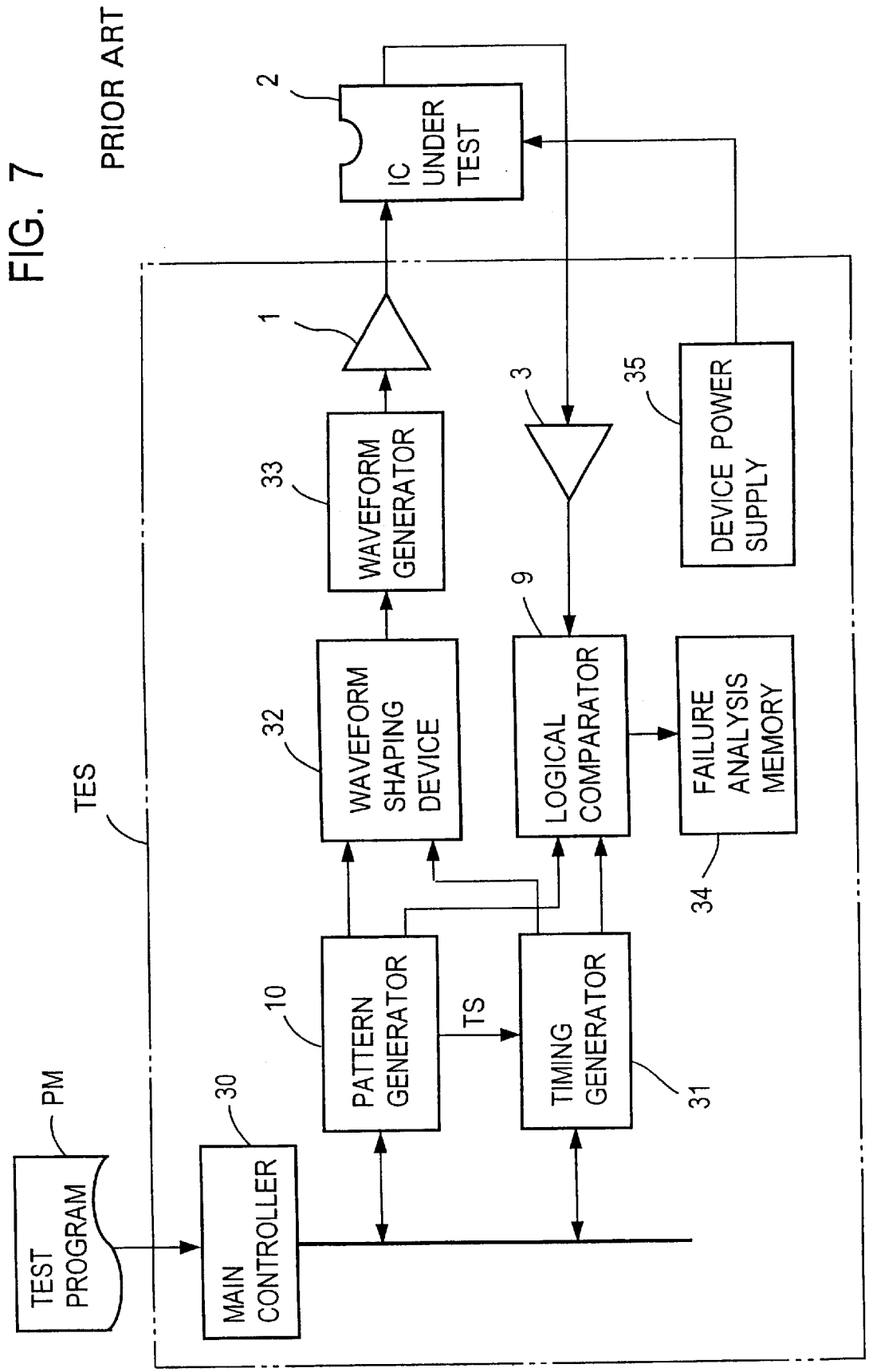
FIG. 7 is a block diagram showing a basic circuit configuration of an IC tester.
Figure 8:
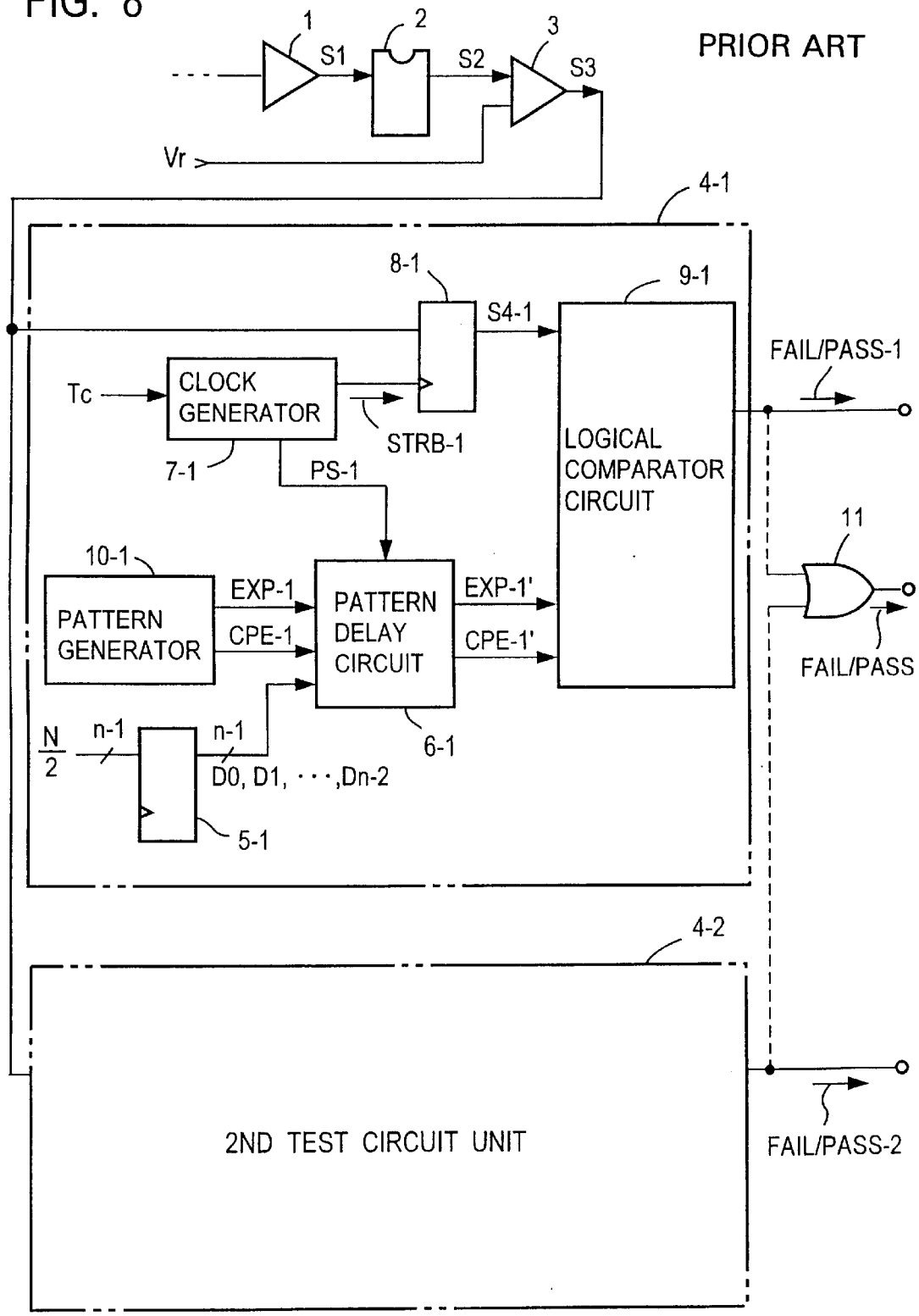
FIG. 8 is a block diagram showing an example of the conventional two-way interleave-type IC tester.
Figure 9:
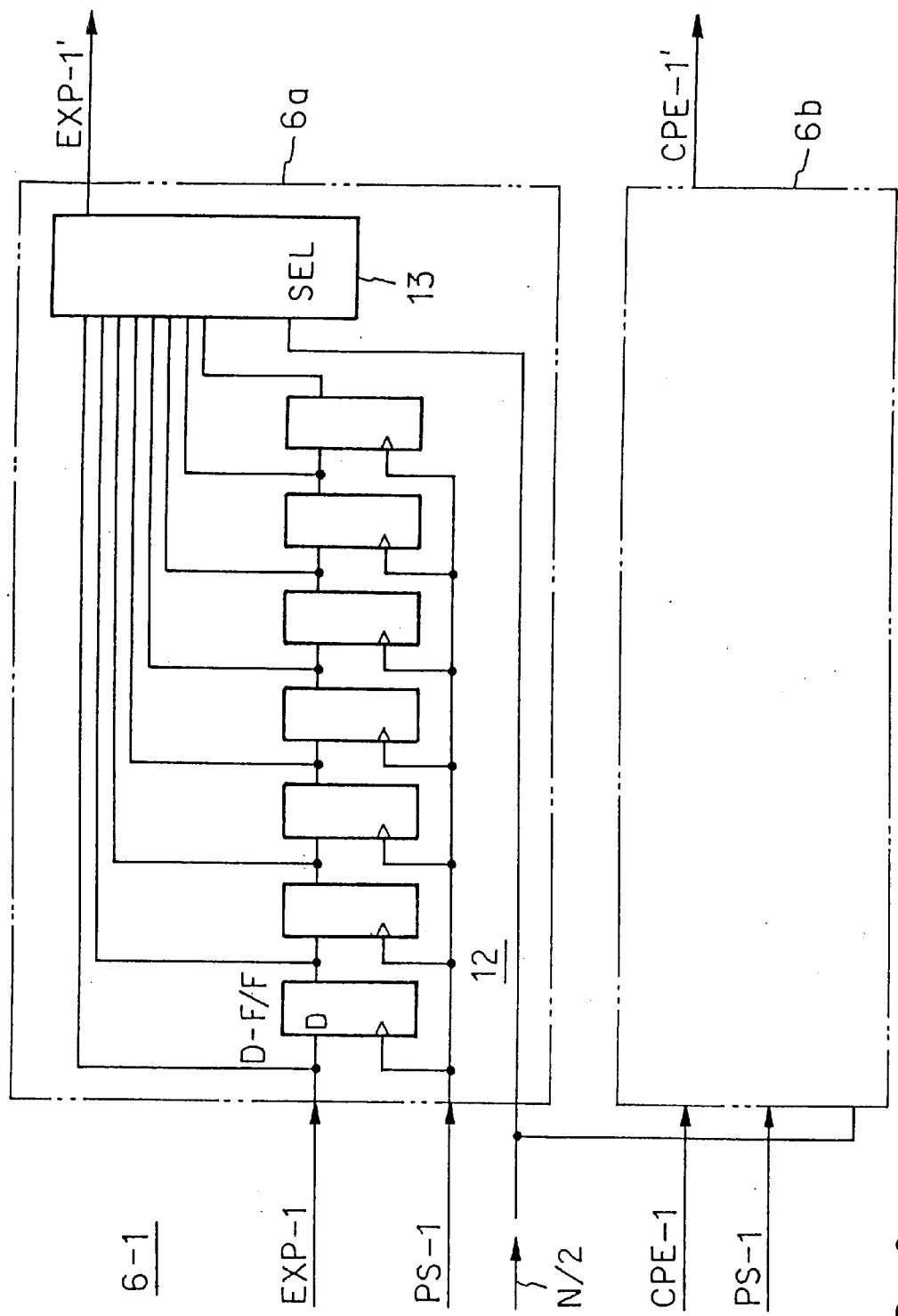
FIG. 9 is a block diagram showing an example of the pattern delay circuit 6 used in the IC tester shown in FIG. 8.

In addition, n data transmission lines D0, D1, D2, ..., Dn−1 are connected to the output sides of the delay setting registers 5-1 and 5-2, respectively. Each of the lines D0 is connected to select terminal SEL of each of the selectors 22-1 and 22-2, and the lines D1, D2, ..., Dn−1 are connected to the pattern delay circuits 6-1 and 6-2, respectively. Further, since the period generator of the timing generator 31, and the waveform shaping device 32 in the test circuit unit shown in FIG. 7 are unnecessary components here, those are removed from FIG. 1.

In the two-way interleave-type IC tester shown in FIG. 1, likewise, the pattern generators 10-1 and 10-2 are alternately operated with the test period (one test cycle) Tr of the IC tester, and test pattern data outputted as a result of the alternate operation of the pattern generators 10-1 and 10-2 are converted to a test pattern signal S1 having a real waveform by waveform shaping devices (not shown) and a waveform generator (not shown). This test pattern signal S1 is applied to the IC under test 2 via the driver group 1. A response signal S2 read out from the IC under test 2 is compared in the level comparator group 3 with a reference voltage Vr from the comparison reference voltage source (not shown) to determine whether the response signal S2 has a predetermined logical level (a voltage of H logic (high logic) or a voltage of L logic (low logic)) or not. The response signal determined to have the predetermined logical level is converted to a logical signal S3 which is in turn sent to the timing comparators 8-1 and 8-2 (8-2 is not shown). The logical signal S3 supplied to the timing comparators 8-1 or 8-2 is then strobed by a strobe signal STRB-1 or STRB-2 outputted from the clock generator 7-1 or 7-2. Generally, a response signal S2 having the predetermined H logic is converted to a logical "1" signal and a response signal S2 having the predetermined L logic is converted to a logical "0" signal, respectively, in the level comparator group 3. In this embodiment, as the timing comparators 8-1 and 8-2 are used D-type flip-flops D-F/F, respectively.

Logical signals S4-1 and S4-2 (S4-2 is not shown) their timings of which are defined by the strobe signals STRB-1 and STRB-2 respectively are supplied to the logical comparators 9-1 and 9-2 (9-2 is not shown), respectively. In the case that the IC under test is not a synchronous type device, the logical signals S4-1 and S4-2 are logically compared with expected value signals (data) EXP-1 and EXP-2 outputted from the pattern generators 10-1 and 10-2, respectively.

If the comparison result thereof indicates an anticoincidence, a failure signal (FAIL) is generated by each of the logical comparator 9-1 and 9-2, and the failure signal is stored in the associated failure analysis memory not shown. Generally, as a failure signal is generated a logical "1" signal which is stored in the same address of the failure analysis memory as that of the IC under test 2. On the contrary, if the comparison result thereof indicates a coincidence, a pass signal (PASS) is generated from each of the logical comparator 9-1 or 9-2. Usually, the pass signal is not stored in the failure analysis memory. Further, in FIG. 1, the failure signals and/or the pass signals respectively outputted from the logical comparators 9-1 and 9-2 are shown by reference characters FAIL/PASS-1 and FAIL/PASS-2, respectively.

Figure 2:
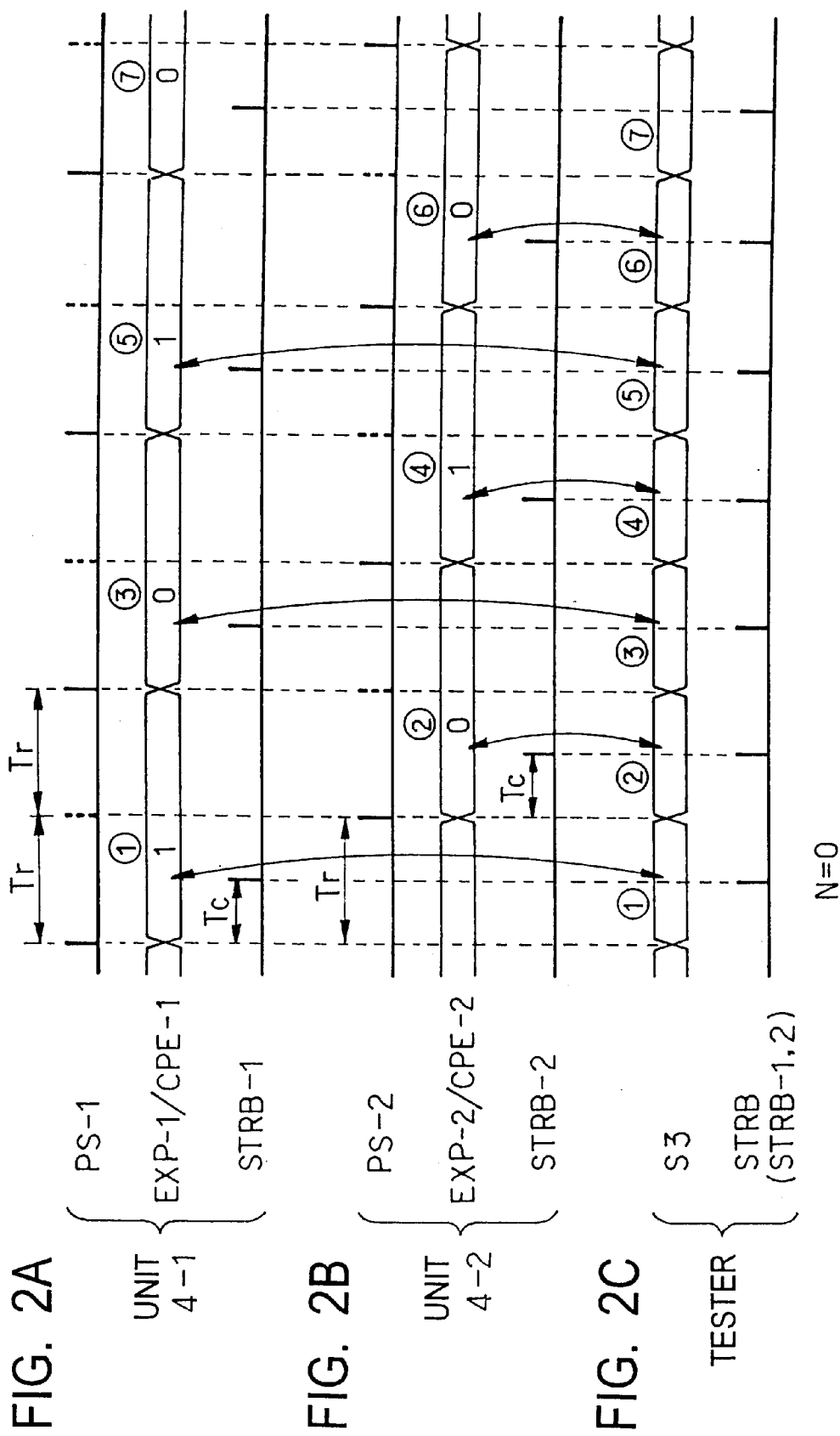
FIGS. 2 (2A, 2B, and 2C) is a timing chart of main portions of the semiconductor device testing apparatus shown in FIG. 1 in the case that the latency N of an IC under test is 0 (zero)
Figure 3:
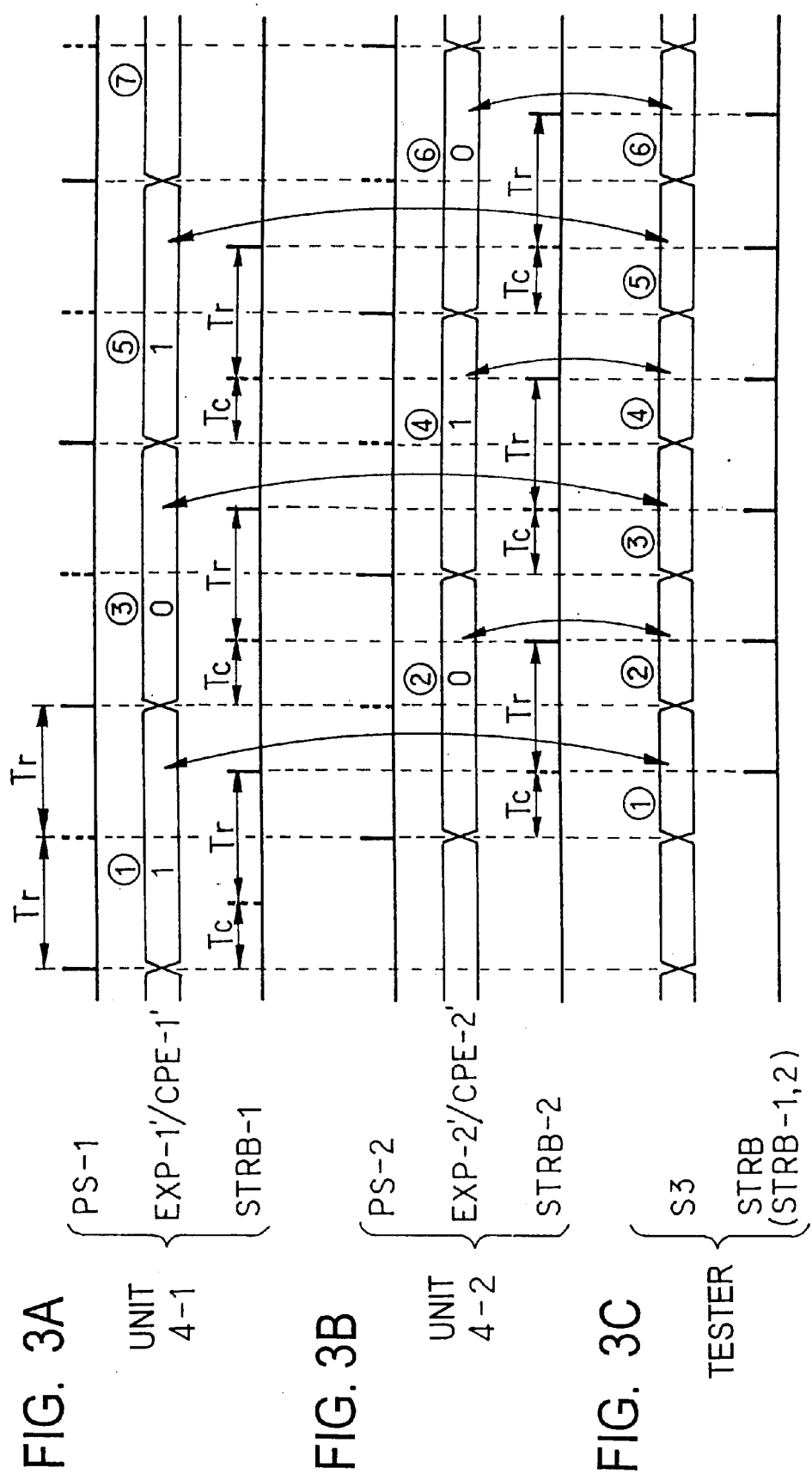
FIGS. 3 (3A, 3B, and 3C) is a timing chart of main portions of the semiconductor device testing apparatus shown in FIG. 1 in the case that the latency N of an IC under test is 1.
Figure 4:
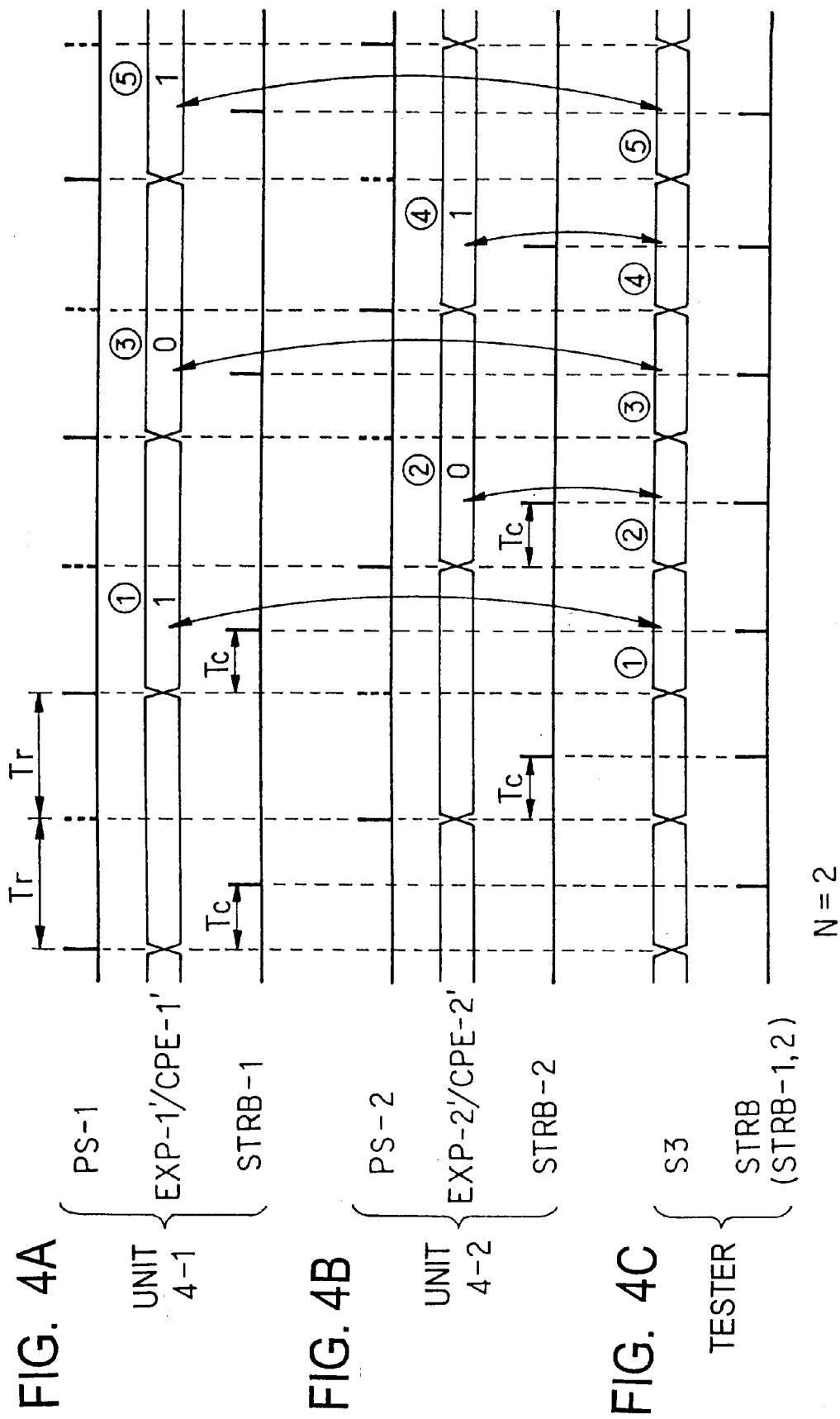
FIGS. 4 (4A, 4B, and 4C) is a timing chart of main portions of the semiconductor device testing apparatus shown in FIG. 1 in the case that the latency N of an IC under test is 2.

Since the IC tester shown in FIG. 1 is a two-way interleave-type one, the operating period (one cycle) of each of the first and the second test circuit units 4-1 and 4-2 is two times the test period Tr of the IC tester. As a result, as shown in FIGS. 2 to 4, the clock generators 7-1 and 7-2 generate period signals PS-1 and PS-2 respectively each having its period of two times the test period Tr of the IC tester, as well as generate strobe signals (clock signals) STRB-1 and STRB-2 respectively each having its period of two times the test period Tr of the IC tester. In addition, the clock generator 7-2 of the second test circuit unit 4-2 generates the period signal PS-2 and the strobe signal STRB-2 at the time point (timing) delayed respectively by the test period Tr of the IC tester from the period signal PS-1 and the strobe signal STRB-1 of the clock generator 7-1 of the first test circuit unit 4-1. In this case, however, since the clock generators 7-1 and 7-2 are set such that the clock setting value Tc or the sum of the clock setting value Tc and the test period Tr is inputted into the clock generators 7-1 and 7-2 so that the strobe signals STRB-1 and STRB-2 are generated at intermediate points of the test period Tr of the IC tester respectively, the strobe signals STRB-1 and STRB-2 are generated from the clock generators 7-1 and 7-2 with a delay time corresponding to the clock setting value Tc or the sum of the clock setting value Tc and the test period Tr from the period signals PS-1 and PS-2, respectively. In other words, the strobe signals STRB-1 and STRB-2 are pulse signals which can be obtained by delaying the period signals PS-1 and PS-2 by the time interval corresponding to the clock setting value Tc or the sum of the clock setting value Tc and the test period Tr.

In the present invention, a latency N of the IC under test 2 is set in the delay setting registers 5-1 and 5-2 of the first and second test circuit units 4-1 and 4-2, respectively, as a delay setting value. Therefore, when the latency N of the IC under test 2 is 0 (zero), a delay setting value N=0 (no delay) is set in the delay setting registers 5-1 and 5-2, respectively. Also, when the latency N of the IC under test 2 is 1, a delay setting value N=1 is set in the delay setting registers 5-1 and 5-2, respectively, and when the latency N of the IC under test 2 is 2, a delay setting value N=2 is set in the delay setting registers 5-1 and 5-2, respectively. In the same manner, when the latency N of the IC under test 2 is i (i=0, 1, 2, 3, ..., 7), a delay setting value i is set in the delay setting registers 5-1 and 5-2, respectively. In this embodiment, the delay setting value N is set, as a binary number of n bits, in the delay setting registers, respectively. However, the present invention is not limited to such setting by use of a binary number. Further, since the operations of the first and the second test circuit units 4-1 and 4-2 are the same, the operation of the first test circuit unit 4-1 will mainly be described below.

As mentioned above, the test period Tr of the IC tester and the clock setting value Tc are added up in the adder 21-1, and the sum result is supplied to an input terminal B of the selector 22-1. On the other hand, the clock setting value Tc is inputted to an input terminal A of the selector 22-1. Assuming that the latency N of the IC under test 2 is expressed by a binary number of n bits as discussed above, a delay setting value (i.e., the latency N of the IC under test 2) to be set in the delay setting register 5-1 becomes a binary number of n bits. Then, with respect to the data transmission lines at the output side of the delay setting register 5-1, the line D0 is set to correspond to the least significant bit (LSB) of the delay setting value, the line D1 is set to correspond to the next lower bit subsequent to the least significant bit of the delay setting value, and similarly, the line Dn−1 is set to correspond to the most significant bit (MSB) of the delay setting value.

Now, assuming that the latency N of the IC under test 2 is a binary number of 3 bits, the latency N can be set from 0 to 7, as shown in FIG. 5. Accordingly, it is possible to delay the output of the IC under test 2 by a time interval from no delay (0) to seven times the test period (7×Tr) at maximum. On the other hand, the data transmission lines at the output side of the delay setting register 5-1 become three lines of D0, D1 and D2 which correspond to the least significant bit (LSB), the next lower bit (the second lower bit) subsequent to the least significant bit and the most significant bit (MSB), respectively. Since each bit takes "0" or "1", the latencies (the delay setting values) 0 and 1 can be expressed only by the least significant bit D0, the latencies 2 and 3 can be expressed by the lower two bits D0 and D1, and the latencies 4 to 7 can be expressed by the three bits D0, D1 and D2.

The selector 22-1 is configured such that it selects the input terminal A when "0" is applied to its select terminal SEL, and selects the input terminal B when "1" is applied to its select terminal SEL. Accordingly, when D0="0" is applied to the select terminal SEL, the clock setting value Tc is outputted from the selector 22-1 and is supplied to the clock generator 7-1, and when D0="1" is applied to the select terminal SEL, the sum (Tc+Tr) of the clock setting value Tc and the test period Tr which is the addition result of the adder 21-1 is outputted from the selector 22-1 and is supplied to the clock generator 7-1. As a result, the clock generator 7-1 generates the strobe signal STRB-1 at a timing which is dependent on the output from the selector 22-1, that is, at a timing delayed by the clock setting value Tc or the sum (Tc+Tr) of the clock setting value Tc and the test period Tr.

FIG. 2 is a timing chart for explaining the operations of the first and the second test circuit units 4-1 and 4-2, and the IC tester in the case that the latency N of the IC under test 2 is 0 (zero), and FIG. 3 is a timing chart for explaining the operations of the first and the second test circuit units 4-1 and 4-2, and the IC tester in the case that the latency N of the IC under test 2 is 1. In addition, FIG. 4 is a timing chart for explaining the operations of the first and the second test circuit units 4-1 and 4-2, and the IC tester in the case that the latency N of the IC under test 2 is 2. Further, in these drawings, it is assumed that each of the expected value signals EXP-1 and EXP-2 as well as comparison enable signals CPE-1 and CPE-2 is outputted, in the first test circuit unit 4-1, in the sequence of logical "1", logical "0", logical "1", ... from the pattern generator 10-1, and is outputted, in the second test circuit unit 4-2, in the sequence of logical "0", logical "1", logical "0", ... from the pattern generator 10-2.

In the case that the latency N of the IC under test 2 is 0 (zero), since a logical "0" is supplied to the select terminal SEL of the selector 22-1 of the clock control circuit 23-1 via the line D0 from the delay setting register 5-1, the strobe signal STRB-1 is generated from the clock generator 7-1, as shown in FIG. 2A, at the timing delayed by the clock setting value Tc. On the other hand, since each of the lines D1 and D2 from the delay setting register 5-1 is in logical "0", the delay amount to be set in the pattern delay circuit 6-1 is 0 (zero). That is, no delay amount is set in the pattern delay circuit 6-1. Consequently, the expected value signal EXP-1 and the comparison enable signal CPE-1 are directly supplied to the logical comparator 9-1 without any delay time. The operation of the second test circuit unit 4-2 is the same as that of the first test circuit unit 4-1 as shown in FIG. 2B.

The logical signal S3 outputted from the level comparator group 3 with the test period Tr of the IC tester is not delayed, and, on the other hand, the strobe signals STRB-1 and STRB-2 are delayed by the clock setting value Tc, respectively. Therefore, as shown in FIG. 2C, these strobe signals STRB-1 and STRB-2 have relation to the strobe operations of the logical signal S3 at the first strobe pulses thereof. Accordingly, the logical signals S4-1 and S4-2 strobed respectively by these strobe signals STRB-1 and STRB-2 in the timing comparators 8-1 and 8-2 are logically compared alternately with the first half of each cycle of the expected value signals EXP-1 and EXP-2 at each test period Tr of the IC tester, in the logical comparators 9-1 and 9-2 as shown in FIG. 2C. Thus, the logical signal S3 can be logically compared at 1/2 of the period of the expected value signal or the strobe signal, at high rate.

Next, in the case that the latency N of the IC under test 2 is 1, since a logical "1" is supplied to the select terminal SEL of the selector 22-1 of the clock control circuit 23-1 via the line D0 from the delay setting register 5-1, the strobe signal STRB-1 is generated, as shown in FIG. 3A, from the clock generator 7-1 at the timing delayed by the sum (Tc+Tr) of the clock setting value Tc and the test period Tr of the IC tester, in this case. On the other hand, since each of the lines D1 and D2 from the delay setting register 5-1 is in logical "0", the delay amount to be set in the pattern delay circuit 6-1 is also 0 (zero). That is, no delay amount is set in the pattern delay circuit 6-1. As a result, the expected value signal EXP-1 and the comparison enable signal CPE-1 are directly supplied to the logical comparator 9-1 without any delay time. The operation of the second test circuit unit 4-2 is the same as that of the first test circuit unit 4-1 as shown in FIG. 3B.

The logical signal S3 outputted from the level comparator group 3 with the test period Tr of the IC tester is delayed by one test period Tr in this case, and, on the other hand, the strobe signals STRB-1 and STRB-2 are delayed by the sum (Tc+Tr) of the clock setting value Tc and the test period Tr of the IC tester, respectively. Accordingly, as shown in FIG. 3C, these strobe signals STRB-1 and STRB-2 have relation to the strobe operations of the logical signal S3 at the first strobe pulses thereof. Therefore, the logical signals S4-1 and S4-2 strobed respectively by these strobe signals STRB-1 and STRB-2 in the timing comparators 8-1 and 8-2 are logically compared alternately with, in this case, the second half (the latter half) of each cycle of the expected value signals EXP-1 and EXP-2 at each test period Tr of the IC tester, in the logical comparators 9-1 and 9-2 as shown in FIG. 3C. Thus, the logical signal S3 can be logically compared at 1/2 of the period of the expected value signal or the strobe signal, at high rate.

Next, in the case of the latency N of the IC under test 2 is 2, since a logical "0" is supplied to the select terminal SEL of the selector 22-1 of the clock control circuit 23-1 via the line D0 from the delay setting register 5-1, the strobe signal STRB-1 is generated, as shown in FIG. 4A, from the clock generator 7-1 at the timing delayed by the clock setting value Tc. On the other hand, the lines D1 and D2 from the delay setting register 5-1 are in logical "1" and logical "0", respectively. If the line D1 is set to correspond to the least significant bit and the line D2 is set to correspond to the higher bit, the lines D1 and D2 form a binary number "01" which expresses a decimal number "1". Therefore, the number of cycles to be delayed (the number of delay cycles) 1 is set in the pattern delay circuit 6-1. As a result, the expected value signal EXP-1 and the comparison enable signal CPE-1 are delayed by one cycle (one operating period) and are supplied to the logical comparator 9-1 as the expected value signal EXP-1' and the comparison enable signal CPE-1'. The operation of the second test circuit unit 4-2 is the same as that of the first test circuit unit 4-1 as shown in FIG. 4B.

The logical signal S3 outputted from the level comparator group 3 with the test period Tr of the IC tester is delayed, in this case, by two test periods 2Tr, and, on the other hand, the strobe signals STRB-1 and STRB-2 are delayed by the clock setting value Tc, respectively. Therefore, as shown in FIG. 4C, the first strobe pulses of these strobe signals STRB-1 and STRB-2 have not relation to the strobe operations of the logical signal S3, but this results in no problem at all. As a result, the logical signals S4-1 and S4-2 strobed respectively by these strobe signals STRB-1 and STRB-2 in the timing comparators 8-1 and 8-2 are logically compared alternately with the first half of each cycle of the expected value signals EXP-1 and EXP-2 at each test period Tr of the IC tester, in the logical comparators 9-1 and 9-2 as shown in FIG. 4C. Thus, the logical signal S3 can be logically compared at 1/2 of the period of the expected value signal or the strobe signal, at high rate.

Next, in the case that the latency N of the IC under test 2 is 3, since a logical "1" is supplied to the select terminal SEL of the selector 22-1 of the clock control circuit 23-1 via the line D0 from the delay setting register 5-1, the strobe signal STRB-1 is generated, similarly to the case that the latency N is 1 as shown in FIG. 3, from the clock generator 7-1 at the timing delayed by the sum (Tc+Tr) of the clock setting value Tc and the test period Tr. On the other hand, the lines D1 and D2 from the delay setting register 5-1 are in logical "1" and logical "0", respectively, like the case that the latency N is 2 as shown in FIG. 4, and the lines D1 and D2 form a binary number "01" which expresses a decimal number "1". Therefore, the number of delay cycles 1 is set in the pattern delay circuit 6-1. As a result, the expected value signal EXP-1 and the comparison enable signal CPE-1 are delayed by one cycle and are supplied to the logical comparator 9-1 as the expected value signal EXP-1' and the comparison enable signal CPE-1'. The operation of the second test circuit unit 4-2 is the same as that of the first test circuit unit 4-1.

The logical signal S3 outputted from the level comparator group 3 with the test period Tr of the IC tester is delayed, in this case, by three test periods 3Tr, and, on the other hand, the strobe signals STRB-1 and STRB-2 are delayed by the sum (Tc+Tr) of the clock setting value Tc and the test period Tr, respectively. Therefore, similarly to the case shown in FIG. 3C, the logical signals S4-1 and S4-1 strobed respectively by these strobe signals STRB-1 and STRB-2 in the timing comparators 8-1 and 8-2 are logically compared alternately with the second half of each cycle of the expected value signals EXP-1 and EXP-2 at the test period Tr of the IC tester, in the logical comparators 9-1 and 9-2. Thus, the logical signal S3 can be logically compared at 1/2 of the period of the expected value signal or the strobe signal, at high rate.

Like the operations described above, in the case that the latency N of the IC under test 2 is 4, 5, 6 or 7, the logical signal S3 outputted with the test period Tr from the level comparator group 3 can also be logically compared at 1/2 of the period of the expected value signal or the strobe signal, at high rate.

In the case that the latency N of the IC under test 2 is 4 or 5, the lines D1 and D2 from the delay setting register 5-1 are in logical "0" and logical "1", respectively, as shown in FIG. 5. The lines D1 and D2 form a binary number "10" which expresses a decimal number "2". Consequently, the number of delay cycles 2 is set in the pattern delay circuit 6-1 and each of the expected value signal EXP-1 and the comparison enable signal CPE-1 is delayed by two cycles. In addition, in the case that the latency N of the IC under test 2 is 6 or 7, the lines D1 and D2 from the delay setting register 5-1 are, as shown in FIG. 5, in logical "1" and logical "1", respectively. The lines D1 and D2 form a binary number "11" which expresses a decimal number "3". Consequently, the number of delay cycles 3 is set in the pattern delay circuit 6-1, and each of the expected value signal EXP-1 and the comparison enable signal CPE-1 is delayed by tree cycles.

As can easily be understood from the above description and FIGS. 2 to 5, in this embodiment, in the case that the latency N of the IC under test is an odd number, this case is processed such that an expected value signal and a comparison enable signal are delayed by the number of cycles expressed by (N−1)/2, and at the same time, a strobe signal is delayed by the sum (Tc+Tr) of the clock setting value Tc and the test period Tr of the IC tester. In the case that the latency N of the IC under test 2 is an even number, the case is processed such that an expected value signal and a comparison enable signal are delayed by the number of cycles expressed by N/2. That is, in the case that the latency N of the IC under test is an odd number, a delay amount of 2Tr×(N−1)/2 is set in the pattern delay circuit, and in the case that the latency N of the IC under test is an even number, a delay amount of 2Tr×N/2 is set in the pattern delay circuit, and further, only when the latency N of the IC under test is an odd number, a new clock setting value consisting of the sum (Tc+Tr) of the clock setting value Tc and the test period Tr of the IC tester is inputted to the clock generator, thereby to generate a strobe signal delayed by the new clock setting value.

The first embodiment described above is a case in which the present invention is applied to a two-way interleave-type IC tester. However, it is needless to say that the present invention can also be applied to a three or more-way interleave-type IC tester.

Figure 6:
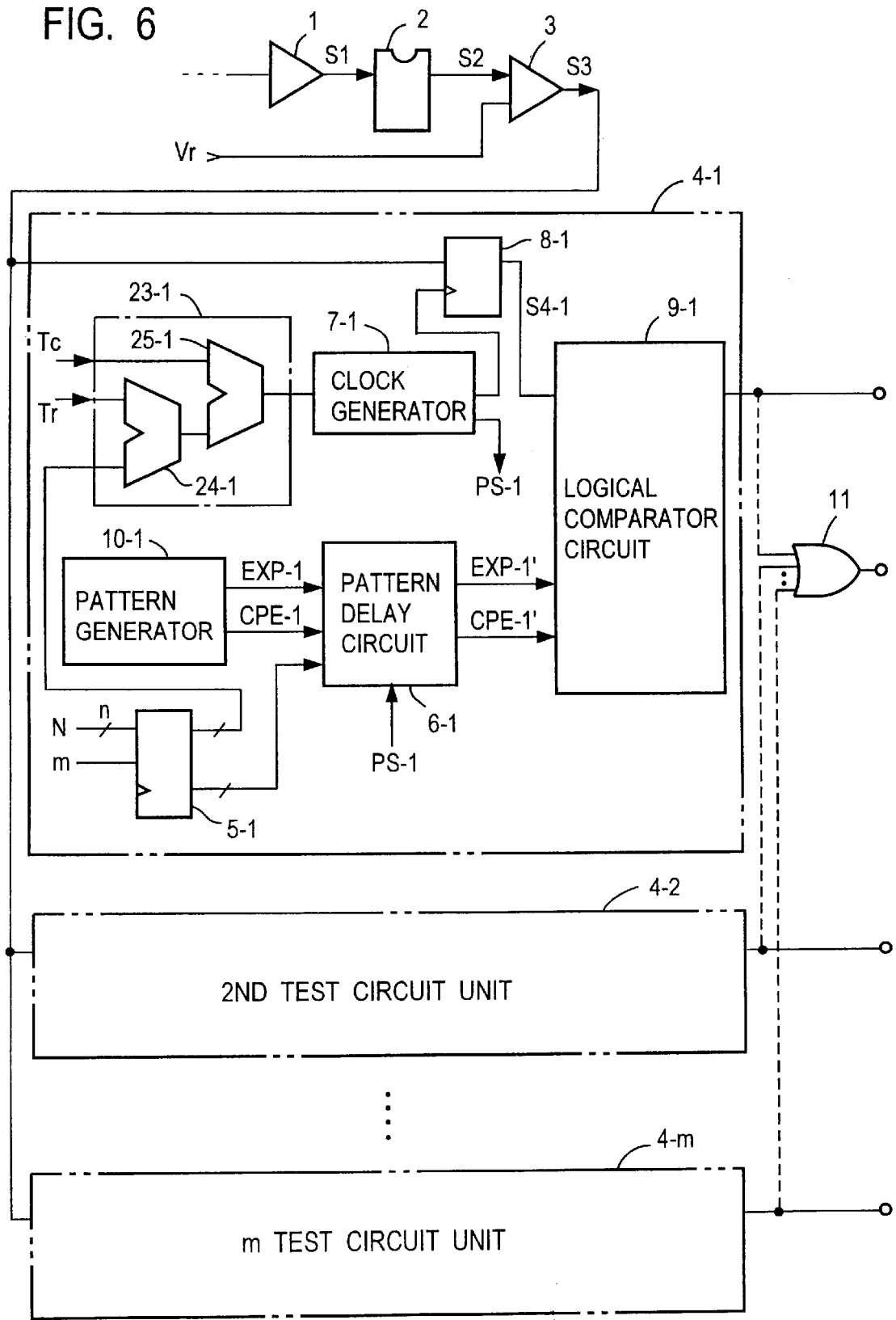
FIG. 6 is a block diagram showing a second embodiment of the semiconductor device testing apparatus according to the present invention.

FIG. 6 is a block diagram showing a second embodiment in which the present invention is applied to a multi-way interleave-type IC tester. Here, it is assumed that the number of interleaves is m (m is an integer equal to or greater than 2), and such IC tester is called m-way interleave-type IC tester. Further, for clarity of the description, portions and components in FIG. 6 corresponding to those in FIG. 1 are shown by the same reference characters affixed thereto and the explanation thereof will be omitted unless it is necessary.

In this embodiment, since the IC tester is an m-way interleave-type one, there are provided in this IC tester m test circuit units 4-1, 4-2, . . . , 4-m, and the IC tester is arranged such that these m test circuit units 4-1 to 4-m are alternately operated (interleaved in operation) in one cycle (one operating period), thereby to generate a test pattern signal S1 to be applied to the IC under test 2 at high rate, and also a response signal S2 is read out from the IC under test 2 at high rate to effect a logical comparison, thereby to perform the test for the IC under test 2 at high speed. Further, since each of the test circuit units has the same circuit configuration, the circuit configuration of the first test circuit unit 4-1 is only specifically shown as a typical example thereof, and the first test circuit unit 4-1 will be mainly described below.

In order to make it possible to test a synchronous type device, there are provided in the first test circuit unit 4-1 a pattern delay circuit 6-1 for delaying an expected value signal/comparison enable signal EXP-1/CPE-1 by a set delay amount, a delay setting register 5-1 for setting a delay time corresponding to a latency N set in the IC under test 2 in the pattern delay circuit 6-1, and a clock control circuit 23-1 for setting a timing of generation of a strobe signal (clock signal) STRB-1 from the clock generator 7-1. This clock control circuit 23-1 comprises, in this embodiment, a multiplier 24-1 and an adder 25-1.

The multiplier 24-1 multiplies the test period (rate) Tr of the IC tester by numerical value data supplied from the delay setting register 5-1, and the result of multiplication and a clock setting value Tc are inputted into the adder 25-1 to add up them. The result of addition is inputted into the clock generator 7-1. For this end, a predetermined number of data transmission lines D0, D1, ..., Dx are connected between the output side of the delay setting register 5-1 and the multiplier 24-1 to transmit numerical value data. Further, in this example, the line D0 is set to correspond to the least significant bit (LSB), the line D1 is set to correspond to the next lower bit subsequent to the least significant bit, ..., and the line Dx is set to correspond to the most significant bit (MSB).

Numerical value data transmitted to the multiplier 24-1 is selected from integers ranging from 0 to m−1 such that when m is 2 (m=2), the numerical value data is 0 and 1, when m=3, the numerical value data is 0, 1 and 2, when m=4, the numerical value data is 0, 1, 2 and 3, .... Giving an example of this numerical value data selecting method, when i is 0 (zero) and positive integers (i=0, 1, 2, 3, 4, 5, ...) and if the quotient of division of the latency N by the number of interleaves m is defined by i+1>N/m □i, it is sufficient that [N−(i×m)] is transmitted to the multiplier 24-1 via the lines D0 to Dx.

Explaining this example method by substituting specific numerical values, in case of m=2, i becomes 0 (i=0) when N=0, and hence the numerical value [N=(i×m)] is 0−0=0, and 0 is transmitted to the multiplier 24-1. When N=1, i also becomes 0 (i=0), and hence the numerical value [N−(i×m)] is 1−0=1, and 1 is transmitted to the multiplier 24-1. When N=2 and 3, i becomes 1 (i=1), and hence 2−2=0 and 3−2=1 are transmitted to the multiplier 24-1. When N=4 and 5, i becomes 2 (i=2), and hence 4−4=0 and 5−4=1 are transmitted to the multiplier 24-1. When N=6 and 7, i becomes 3 (i=3), and hence 6−6=0 and 7−6=1 are transmitted to the multiplier 24-1. Likewise, similar operations are repetitively done. As is apparent from the above explanation, the numerical values 0 and 1 are always transmitted to the multiplier 24-1 via the lines D0 to Dx. Since the numerical values 0 and 1 are expressed by one bit, it is sufficient to use only the line D0 corresponding to the least significant bit among the lines D0 to Dx.

In case of m=3, when N=0, 1 and 2, i becomes 0 (i=0), and hence the numerical value [N−(i×m)] is 0−0=0, 1−0=1 and 2−0=2. As a result, 0, 1 and 2 are transmitted to the multiplier 24-1. When N=3, 4 and 5, i becomes 1 (i=1), and hence 3−3=0, 4−3=1 and 5−3=2 are transmitted to the multiplier 24-1. When N=6, 7 and 8, i becomes 2 (i=2), and hence 6−6=0, 7−6=1 and 8−6=2 are transmitted to the multiplier 24-1 . When N=9, 10 and 11, i becomes 3 (i=3), and hence 9−9=0, 10−9=1 and 11−9=2 are transmitted to the multiplier 24-1. Likewise, similar operations are repetitively effected. As is apparent from the above explanation, the numerical values 0, 1 and 2 are always transmitted to the multiplier 24-1 via the lines D0 to Dx. Since the numerical values 0, 1 and 2 are expressed by two bits, it is sufficient to use only the two lines D0 and D1 among the lines D0 to Dx. In case of m=4, 5, 6, ..., like the above cases, it is clear that the numerical values from 0 to m−1 can also be obtained, and hence the explanation thereof will be omitted.

From the results described above, in case of m=2, it is sufficient that only the least significant bit line D0 is connected to the multiplier 24-1, in case of m=3, it is sufficient that the lines D0 and D1 are connected to the multiplier 24-1, and in case of m=m, it is sufficient that the lines D0 to Dm-1 are connected to the multiplier 24-1.

Since the IC tester shown in FIG. 6 is an m-way interleave-type one, the operating period (one cycle) of each of the test circuit units is m times the test period Tr of the IC tester (m×Tr). As a result, the clock generator 7-1 generates a period signal PS-1 and a strobe signal STRB-1 each having the period of m times the test period Tr of the IC tester. In addition, the clock generators of the second test circuit unit and the subsequent test circuit units generate period signals and strobe signals at the time points (timings) sequentially delayed by the test period Tr of the IC tester from the period signal PS-1 and the strobe signal STRB-1 of the clock generator 7-1 of the first test circuit unit 4-1, respectively.

Also, between the pattern delay circuit 6-1 and the output side of the delay setting register 5-1 are connected a predetermined number of data transmission lines D0, D1, ..., Dy through which numerical value data depending upon the latency N is transmitted to the pattern delay circuit. Numerical value data transmitted to the pattern delay circuit 6-1 is selected from an integer part of the quotient of division of the latency N by the number of interleaves m and 0. Giving an example of this numerical value data selecting method, when k is 0 (zero) and positive integers (k=0, 1, 2, 3, 4, 5, ...), and if the quotient of division of the latency N by the number of interleaves m is defined by k+1>N/m □k, it is sufficient that k is transmitted to the pattern delay circuit 6-1.

Explaining this example method by substituting specific numerical values, in case of m=2, when the latency N is equal to 0 (N=0), the integer part of N/m becomes 0 (N/m=0), and when N=1, the integer part of N/m also becomes 0. Accordingly, when N=0 and 1, the integer part of N/m becomes 0 in both cases, and 0 is transmitted to the pattern delay circuit 6-1. When N=2 and 3, the integer part of N/m becomes 1 in both cases, and hence 1 is transmitted to the pattern delay circuit 6-1. When N=4 and 5, the integer part of N/m becomes 2 in both cases, and hence 2 is transmitted to the pattern delay circuit 6-1. When N=6 and 7, the integer part of N/m becomes 3 in both cases, and hence 3 is transmitted to the pattern delay circuit 6-1. Likewise, similar operations are repetitively done. As is apparent from the above explanation, the numerical value data varying depending upon the latency N is transmitted to the pattern delay circuit 6-1 via the lines D0 to Dy.

In addition, in case of m=3, when the latency N is equal to 0, 1 and 2 (N=0, 1 and 2), the integer part of N/m becomes 0 in all three cases. Therefore, when N=0, 1 and 2, 0 is transmitted to the pattern delay circuit 6-1. When N=3, 4 and 5, the integer part of N/m becomes 1 in all three cases, and hence 1 is transmitted to the pattern delay circuit 6-1. When N=6, 7 and 8, the integer part of N/m becomes 2 in all three cases, and hence 2 is transmitted to the pattern delay circuit 6-1 . When N=9, 10 and 11, the integer part of N/m becomes 3 in all three cases, and hence 3 is transmitted to the pattern delay circuit 6-1. Likewise, similar operations are repetitively effected. As is apparent from the above explanation, the numerical value data varying depending upon the latency N is transmitted to the pattern delay circuit 6-1 via the lines D0 to Dy. Accordingly, it is necessary that the number of lines capable of transmitting these numerical value data is provided as the lines D0 to Dy. In case of m=4, 5, 6, ..., like the above cases, it is clear that similar numerical value data can also be obtained, and hence the explanation thereof will be omitted.

Alternatively, it may be constructed that the division of N by m is done in the pattern delay circuit 6-1, and the integer part of the quotient (N/m) resulting from the division is set as a delay amount. In this case, any numerical value down to the decimal point of the quotient is regarded as 0. For example, in case of m=2, when the latency N is equal to 0 and 1, the quotient (N/m) becomes 0 and 0.5 (1/2) in which the integer part is 0. Since the numerical value down to the decimal point (5) is regarded as 0, the delay amount to be set becomes "0". In case of N=2, 2/2 becomes 1(2/2=1), and hence "1" is unquestionably set as the delay amount. In case of N=3, 3/2 becomes 1.5 (3/2=1.5), and hence the integer part thereof "1" is set as the delay amount. In case of N=4 and 5, the integer part "2" in both cases is set as the delay amount. Likewise, similar operations are repetitively done. In this alternative case, there are obtained advantages that the latency N set in the delay setting register 5-1 as a binary number of n bits can be transmitted directly to the pattern delay circuit 6-1 as it is, and that if the number of interleaves m is set as a binary number of predetermined bits, the number of interleaves m can also be transmitted directly to the pattern delay circuit 6-1 as it is.

The pattern delay circuit 6-1 delays the expected value signal EXP-1 and the comparison enable signal CPE-1 by a delay time corresponding to the delay amount (numerical value) set as mentioned above. Specifically, the pattern delay circuit 6-1 delays the expected value signal EXP-1 and the comparison enable signal CPE-1 by a delay time obtained by multiplication of the set numerical value by the operating period m×Tr (one cycle) of the test circuit unit 4-1.

In this second embodiment, the latency N of the IC under test 2 and the number of interleaves m are set in the delay setting register of each of the test circuit units. Each of the latency N and the number of interleaves m may be set as a binary number of predetermined bits.

In the m-way interleave-type IC tester constructed as mentioned above, if m is equal to 2 which corresponds to two-way interleave operation, as discussed above, the numerical value transmitted to the multiplier 24-1 varies such as 0 when the latency N=0, 1 when N=1, 0 when N=2, 1 when N=3, 0 when N=4, 1 when N=5, .... Accordingly, the output of the multiplier 24-1 becomes 0 when the latency N=0, 2, 4, 6, 8, 10, ..., and becomes the test period Tr of the IC tester when N=1, 3, 5, 7, 9, 11, .... As a result, the output of the adder 25-1 becomes Tc, Tc+Tr, Tc, Tc+Tr, ... as the latency N varies in the order of 0, 1, 2, 3, .... That is, the adder 25-1 repetitively outputs Tc and Tc+Tr. Thus, the output of the adder 25-1 coincides with the output of the clock control circuit shown in FIG. 1.

On the other hand, in the pattern delay circuit 6-1 is set the integer part of the quotient of the division of the latency N (numerical value) by m=2, the latency N being transmitted via the lines D0 to Dy at the output side of the delay setting register 5-1. The numerical value transmitted to the pattern delay circuit 6-1 varies as 0, 0; 1, 1; 2, 2; 3, 3; . . . when the latency N varies in the order of 0; 1; 2; 3; .... As a result, the pattern delay circuit 6-1 delays the expected value signal EXP-1 and the comparison enable signal CPE-1 by a delay time obtained by multiplication of such numerical value by the operating period (cycle). Accordingly, the pattern delay circuit 6-1 can give the same delay time as that in the first embodiment discussed above to the expected value signal EXP-1 and the comparison enable signal CPE-1 respectively so that a logical comparison operation will be carried out in the logical comparator 9-1, as already shown in FIGS. 2C, 3C and 4C.

Next, in case of m=3, the numerical value transmitted to the multiplier 24-1 varies such as 0 when the latency N=0, 1 when N=1, 2 when N=2, 0 when N=3, 1 when N=4, 2 when N=5, 0 when N=6, 1 when N=7, 2 when N=8, 0 when N=9, .... Accordingly, the output of the multiplier 24-1 becomes 0 when the latency N=0, 3, 6, 9, ..., becomes the test period Tr of the IC tester when N=1, 4, 7, 10, ..., and becomes 2×Tr when N=2, 5, 8, 11, .... As a result, the output of the adder 25-1 repeats Tc, Tc+Tr, Tc+2Tr as the latency N varies in the order of 0, 1, 2, 3, ....

On the other hand, the numerical value transmitted to the pattern delay circuit 6-1 via the data transmission lines D0 to Dy varies such as 0 when the latency N=0, 0 when N=1, 0 when N=2, 1 when N=3, 1 when N=4, 1 when N=5, ... Therefore, in the pattern delay circuit is set the numerical value which varies as 0, 0, 0; 1, 1, 1; 2, 2, 2; 3, 3, 3; ... when the latency N varies in the order of 0; 1; 2; 3; 4; .... The pattern delay circuit 6-1 delays the expected value signal EXP-1 and the comparison enable signal CPE-1 by a delay time obtained by multiplication of such set numerical value by the operating period (cycle).

As a result, when the latency N is equal to 0, 3, 6, 9, ..., with respect to the expected value signal EXP-1, the first 1/3 of each of cycles thereof corresponding to the first test period, the fourth test period, the seventh test period, ... in the test period Tr of the IC tester are logically compared with the logical signal S4-1 strobed by the strobe signal STRB-1 in the timing comparator 8-1. Likewise, when the latency N is equal to 1, 4, 7, 10, ..., the second or middle 1/3 of each of cycles of the expected value signal EXP-1 corresponding to the second test period, the fifth test period, the eighth test period, in the test period Tr of the IC tester are logically compared with the logical signal strobed by the strobe signal in the timing comparator. Furthermore, when the latency N is equal to 2, 5, 8, 11, ..., the third or last 1/3 of each of cycles of the expected value signal EXP-1 corresponding to the third test period, the sixth test period, the ninth test period, ... in the test period Tr of the IC tester are logically compared with the logical signal strobed by the strobe signal in the timing comparator. Accordingly, each of the logical signals S3 outputted from the level comparator group 3 is logically compared at high rate in the logical comparator at the test period Tr of the IC tester, that is, at 1/3 of the period of the expected value signal or the strobe signal. The operations in the cases that m is equal to 4 or greater than 4 can be readily understood from the above discussion, and the explanation thereof will be omitted.

In the first and the second embodiments shown in FIGS. 1 and 6, respectively, a delay setting register is provided in each test circuit unit. However, one delay setting register may commonly be used among the test circuit units.

As is apparent from the above description, according to the present invention, in the case that a synchronous type semiconductor device under test is tested in a multi-way interleave-type semiconductor device testing apparatus, the test can be performed, in either case that the latency N of the semiconductor device under test is an odd number or an even number, by directly setting the latency N in a delay setting register. Therefore, there is obtained a remarkable advantage that the serious drawback of the prior art IC tester which cannot test an IC under test unless its latency N is an even number is removed. In addition, an advantage is also obtained that the workability of the IC tester is significantly improved since the latency N of the semiconductor device under test can be set directly in the delay setting register as it is, that is, it is unnecessary to set N/2 in the delay setting register.

What is claimed is:
1. A semiconductor device testing apparatus in which a test pattern signal is produced on the basis of test pattern data outputted from a pattern generator and is applied to a semiconductor device under test, and a response signal outputted from the semiconductor device under test is logically compared with an expected value signal outputted from said pattern generator, thereby to determine whether the semiconductor device under test is defective or not defective, and comprising a plurality of test circuit units each comparing a response signal from the semiconductor device under test with an expected value signal from the pattern generator, said plurality of test circuit units being sequentially operated within one cycle thereby effecting logical comparisons at high rate, each of the plurality of test circuit units comprising:

a clock generator for generating a period signal representing an operating period of associated one test circuit unit;

a delay setting register in which a latency N is set, said latency N being the number of cycles that an output of a semiconductor device under test is to be delayed;

a pattern delay circuit connected to the output side of said delay setting register via a required number of data transmission lines and for delaying the expected value signal by a time interval obtained by multiplying numerical value data transmitted from the delay setting register by the operating period;

clock control means connected to the output side of said delay setting register via a required number of data transmission lines and for selecting, in response to numerical value data transmitted from the delay setting register, one of plural timing setting values to supply the selected timing setting value to the clock generator, each of said plural timing setting values setting a timing of generation of the period signal generated from the clock generator; and means for logically comparing a response signal from the semiconductor device under test with an expected value signal from the pattern delay circuit.

2. The semiconductor device testing apparatus as set forth in claim 1, wherein the number of said test circuit units is two;

said clock control means comprises:

adding means for adding up a test period Tr of the semiconductor device testing apparatus and a clock setting value Tc in which a timing of generation of the period signal generated from the clock generator has been preset; and a selector having a select terminal to which the least significant bit line among the data transmission lines is connected and for selecting the clock setting value Tc when the least significant bit line is "0", and selecting the sum Tc+Tr of the clock setting value and the test period which is the output of the adding means when the least significant bit line is "1", and all higher bit lines among the data transmission lines except the least significant bit line are connected to the pattern delay circuit.

3. The semiconductor device testing apparatus as set forth in claim 2, wherein said pattern delay circuit delays the expected value signal by a delay time obtained by multiplying transmitted numerical value data by the test period.

4. The semiconductor device testing apparatus as set forth in claim 3, wherein the plurality of test circuit units use setting register in common.

5. The semiconductor device testing apparatus as set forth in claim 2, wherein the plurality of test circuit units use one delay setting register in common.

6. The semiconductor device testing apparatus as set forth in claim 1, wherein said clock control means comprises:

a multiplier for multiplying numerical value data transmitted via the data transmission lines by a test period Tr of the semiconductor device testing apparatus; and adding means for adding up an output from said multiplier and a clock setting value Tc in which a timing of generation of the period signal generated from the clock generator has been preset, and the number of interleaves m is further set in the delay setting register, and the latency N and the number of interleaves m are transmitted to pattern delay circuit via the data transmission lines.

7. The semiconductor device testing apparatus as set forth in claim 6, wherein said pattern delay circuit takes out, from the latency N and the number of interleaves m transmitted thereto, the integer part of the quotient resulting from a division of N by m, and delays the expected value signal by a delay time obtained by multiplying the integer part by the test period.

8. The semiconductor device testing apparatus as set forth in claim 1, wherein said clock control means comprises:

a multiplier for multiplying numerical value data transmitted via the data transmission lines by a test period Tr of the semiconductor device testing apparatus; and adding means for adding up an output from said multiplier and a clock setting value Tc in which a timing of generation of the period signal generated from the clock generator has been preset, and the number of interleaves m is further set in the delay setting register, and the integer part of the quotient resulting from a division of the latency N by the number of interleaves m is transmitted to pattern delay circuit via the data transmission lines.

9. The semiconductor device testing apparatus as set forth in claim 8, wherein said pattern delay circuit delays the expected value signal by a delay time obtained by multiplying transmitted numerical value data by the test period.

10. The semiconductor device testing apparatus as set forth in claim 1, wherein the plurality of test circuit units use one delay setting register in common.

* * * * *